(12) United States Patent  (10) Patent No.: US 7,732,504 B2
Dietliker et al.  (45) Date of Patent: Jun. 8, 2010

(54) FUNCTIONALIZED PHOTOINITIATORS

(75) Inventors: Kurt Dietliker, Allschwil (CH); Rinaldo Hüsler, Basel (CH); Jean-Luc Birbaum, Binningen (CH); Jean-Pierre Wolf, Maisprach (CH)

(73) Assignee: Ciba Specialty Chemicals Corporation, Tarrytown, NY (US)

( * ) Notice: Subject to any disclaimer, the term of this patent is extended or adjusted under 35 U.S.C. 154(b) by 620 days.

(21) Appl. No.: 10/587,584

(22) PCT Filed: Jan. 24, 2005

(86) PCT No.: PCT/EP2005/050276

§ 371 (c)(1),
(2), (4) Date: Jul. 13, 2007

(87) PCT Pub. No.: WO2005/076074

PCT Pub. Date: Aug. 18, 2005

(65) Prior Publication Data

US 2008/0021126 A1  Jan. 24, 2008

(30) Foreign Application Priority Data

Feb. 2, 2004 (EP) .................................. 04100365

(51) Int. Cl.
*C08F 2/50* (2006.01)
(52) U.S. Cl. ............................. 522/34; 522/36; 522/39; 522/75; 522/92; 522/93
(58) Field of Classification Search .................. 522/34, 522/36, 39, 75, 92, 93
See application file for complete search history.

(56) References Cited

U.S. PATENT DOCUMENTS

| 4,318,791 A | * | 3/1982 | Felder et al. ................... 522/33 |
| 4,582,862 A | * | 4/1986 | Berner et al. .................. 522/14 |
| 4,739,052 A | * | 4/1988 | Husler et al. ................. 544/174 |
| 4,992,547 A |   | 2/1991 | Berner et al. ................ 544/162 |
| 5,554,663 A | * | 9/1996 | Desobry et al. ................. 522/8 |
| 5,698,285 A | * | 12/1997 | Kojima ....................... 428/65.2 |
| 6,048,667 A | * | 4/2000 | Eldin et al. ............... 430/281.1 |
| 2003/0225179 A1 |  | 12/2003 | Chiu et al. .................. 522/136 |
| 2004/0068110 A1 |  | 4/2004 | Chiu et al. .................. 544/170 |

* cited by examiner

*Primary Examiner*—Susan W Berman
(74) *Attorney, Agent, or Firm*—Joseph C. Suhadolnik

(57) ABSTRACT

The invention relates to novel photoinitiators of formula (I) wherein each of the substituents is given the definition as set forth in the Specification and the claims. The photoinitiators can be used to prepare multifunctional photoinitiators.

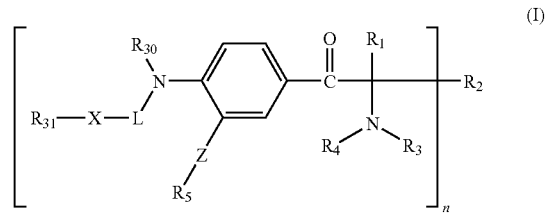

6 Claims, No Drawings

FUNCTIONALIZED PHOTOINITIATORS

The present invention relates to novel derivatives of alpha-aminoketones, to their use as photoinitiators for the photopolymerization of ethylenically unsaturated compounds and to their use to prepare multifunctional photoinitiators.

Alpha-aminoketone compounds are well known photoinitiators. Commercially available is for Example Irgacure 369® and Irgacure 907®.

Derivatives of alpha-aminoketones, which have an amino group in the 4-position of the phenyl radical are described, for example, in EP138 754 A2.

The European Patent Publication EP 284561 B1 describes photoinitiators of the formula Ar—CO—C($R_1R_2$)—N($R_3R_4$) or Ar—CO—C($R_1R_2$)—X—C($R_1R_2$)—CO—Ar or Ar—CO—C($R_1NR_3R_4$)—Y—C($R_1NR_3R$)—CO—Ar, wherein Ar is e.g. phenyl optionally substituted by $NR_7R_8$.

The European Patent Publication EP 1 357 117 A2 describes novel aminoketone derivatives, obtainable by reacting 1-{4-[bis-(2-hydroxy-ethyl)-amino]}-2-methyl-2-morpholino-1-propanone or 2-(dimethylamino)-1-{4-[(2-hydroxyethyl)methylamino]-phenyl}-2-phenylmethyl-1-butanone with ε-caprolactone.

U.S. Pat. No. 6,022,906 describes photoinitiators of the formula Y—X—Ar—CO—C($R_1R_2$)—N($R_3R_4$) provided that at least one of the radicals is substituted by SH. These photoinitiators are prepared using, for example, 1-[4-(3-Hydroxypropylamino)phenyl]-2-dimethylamino-2-benzyl-propan-1-one or 1-[4-(3-Hydroxypropylamino)phenyl]-2-dimethylamino-2-benzyl-butan-1-one. These intermediate compounds have not been described as photoinitiators.

U.S. Pat. No. 4,992,547 discloses aminoarylketone photoinitiators of the formula Ar—CO—C($R_1R_2$)—N($R_3R_4$) e.g. 2-methyl-1-[4-(N-(2-hydroxyethyl)-N-methylamino)phenyl]-2-dimethylaminopropan-1-one.

There is an increasing need to minimize the emission of volatile organic components before curing and to minimize the migration and/or extraction of residual photoinitiator components from the cured product, while maintaining high initiator efficiency. For example, inks used in printing on plastics food packaging should ideally meet the standards for minimization of extractable compounds from the coated and/or printed plastics. Such contamination can cause problems of taint and odor of the foodstuff. Moreover, for other coating compositions, it is important to minimize migration of reactive materials, which may cause other undesirable effects such as loss of adhesion to the substrate or yellowing.

One approach is to use photoinitiators of increased molecular size to reduce the level of migratable and/or extractable residual photoinitiator components in a cured coating or ink composition. Such polymeric photoinitiators are, for example, disclosed in EP0 161 463 A1 and include a commercially available compound, Fratelli-Lamberti's KIP 100. However, polymeric photoinitiators are often high viscose, which makes the handling difficult.

The problem to be solved by the present invention is the provision of alpha-aminoketone photoinitiators having a high reactivity, a low odor, a low migration and in addition are able to react with the reagents listed in the application such as e.g. with acids, aldehydes, ketones and the like, to build up multifunctional photoinitiators.

The invention relates to photoinitiators of the formula I

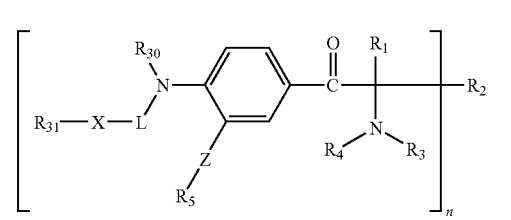

wherein
n is 1 or 2;
L is a linker;
X is —O—, —S— or —$NR_{32}$—;
Z is a direct bond, —$CH_2$—, —O—, —S— or —$NR_{10}$—;
$R_1$ is
  (a) linear or branched $C_1$-$C_{12}$-alkyl, which is unsubstituted or substituted by one or more of the groups $C_1$-$C_4$-alkyoxy, phenoxy, halogen or phenyl;
  (b) a radical of the formula

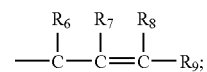

(c) a radical of the formula

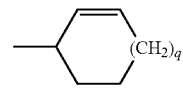

where q is 0, 1, 2 or 3; or
  (d) a radical of the formula

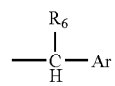

where Ar is phenyl, which is unsubstituted or substituted by one or more of the groups halogen, OH, $NO_2$, —N($R_{10}$)$_2$, $C_1$-$C_{12}$-alkyl, $C_1$-$C_4$-alkyl that is additionally substituted by OH, halogen, N($R_{10}$)$_2$, $C_1$-$C_{12}$-alkoxy, —COO($C_1$-$C_{18}$-alkyl), —CO(O$CH_2CH_2$)$_n$O$CH_3$ or —OCO($C_1$-$C_4$-alkyl); $C_1$-$C_{12}$-alkyoxy, $C_1$-$C_4$-alkyoxy that is additionally substituted by —COO($C_1$-$C_{18}$-alkyl) or —CO(O$CH_2CH_2$)$_n$O$CH_3$; —OCO($C_1$-$C_4$-alkyl), $C_1$-$C_8$-alkylthio, phenoxy, —COO ($C_1$-$C_{18}$-alkyl), —CO(O$CH_2CH_2$)$_n$O$CH_3$, phenyl or benzoyl; where n is 1-20;
$R_2$ if n is 1, independently of $R_1$ has one of the meanings of $R_1$; or
$R_1$ together with $R_2$ forms a ring of the formula

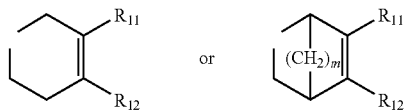

where m is 1 or 2;

$R_2$ if n is 2, is a direct bond, $C_2$-$C_{16}$-alkylene, cyclohexylene, xylylene, dihydroxyxylylene, $C_4$-$C_8$-alkenediyl, $C_6$-$C_{10}$-alkadienediyl or dipentenediyl;

$R_3$ is hydrogen, $C_1$-$C_{12}$-alkyl, $C_2$-$C_4$-alkyl substituted by one or more of the groups hydroxy, $C_1$-$C_4$-alkoxy, —CN, —COO($C_1$-$C_4$-alkyl); $C_3$-$C_5$-alkenyl, $C_5$-$C_{12}$-cycloalkyl or $C_7$-$C_9$-phenylalkyl;

$R_4$ is $C_1$-$C_{12}$-alkyl, $C_2$-$C_4$-alkyl substituted by one or more of the groups hydroxy, $C_1$-$C_4$-alkoxy, —CN, —COO($C_1$-$C_4$-alkyl); $C_3$-$C_5$-alkenyl, $C_5$-$C_{12}$-cycloalkyl, $C_7$-$C_9$-phenylalkyl, phenyl; or $R_4$ and $R_2$ together is $C_1$-$C_7$-alkylene, $C_7$-$C_{10}$-phenylalkylene, o-xlylene, 2-butenylene or $C_2$-$C_3$-oxa- or azaalkylene; or $R_4$ and $R_3$ together is $C_3$-$C_7$-alkylene that may be interrupted by —O—, —S—, —CO— or —N($R_{13}$)— and substituted by hydroxy, $C_1$-$C_4$-alkoxy or —COO($C_1$-$C_4$-alkyl);

$R_5$ is hydrogen or $C_1$-$C_4$-alkyl; or $R_5$ together with $R_{30}$ is $C_1$-$C_2$-alkylene;

$R_6$ is hydrogen, $C_1$-$C_8$-alkyl or phenyl;

$R_7$, $R_8$ and $R_9$ independently of each other are hydrogen or $C_1$-$C_4$-alkyl, or $R_7$ and $R_8$ together are $C_3$-$C_7$-alkylene;

$R_{10}$ is hydrogen, $C_1$-$C_8$-alkyl, $C_3$-$C_5$-alkenyl, $C_7$-$C_9$-phenylalkyl, $C_1$-$C_4$-hydroxyalkyl or phenyl;

$R_{11}$ and $R_{12}$ independently of each other are hydrogen or $C_1$-$C_4$-alkyl, or $R_{11}$ and $R_{12}$ together are $C_3$-$C_7$-alkylene;

$R_{13}$ is hydrogen, $C_1$-$C_{12}$-alkyl, which may be interrupted by one or more —O— or $C_3$-$C_5$-alkenyl, $C_7$-$C_9$-phenylalkyl, $C_1$-$C_4$-hydroxyalkyl, —CH$_2$CH$_2$CN, —CH$_2$CH$_2$COO($C_1$-$C_4$-alkyl), $C_2$-$C_8$-alkanoyl, or benzoyl;

$R_{30}$ and $R_{31}$ independently of one another are hydrogen, $C_1$-$C_{18}$-alkyl or $C_1$-$C_{18}$-alkyl substituted by hydroxy, $C_1$-$C_4$-alkoxy, —O—CO—($C_1$-$C_4$-alkyl), —CN and/or —COO($C_1$-$C_4$-alkyl); $C_3$-$C_{18}$-alkenyl, $C_5$-$C_{12}$-cycloalkyl, $C_7$-$C_9$-phenylalkyl, $C_2$-$C_{18}$-alkanoyl, benzoyl or norbornenoyl; or $C_2$-$C_{18}$-alkanoyl, benzoyl or norbornenoyl substituted by $C_1$-$C_4$-alkoxy, —NR$_{33}$R$_{34}$, —SR$_{35}$, —COOH or —COO($C_1$-$C_4$-alkyl); or benzoyl or norbornenoyl substituted by hydroxy, or $C_3$-$C_5$-alkenoyl, —SO$_2$—($C_1$-$C_{12}$-alkyl) or —SO$_2$—($C_1$-$C_{12}$-alkylphenyl); or —CO—NH—$C_1$-$C_{12}$-alkyl or —CO—NH—($C_0$-$C_{12}$-Alkylen)-N=C=O optionally interrupted by one or two phenylene, methylphenylene, phenylene-O-phenylene, cyclohexanediyl, methylcyclohexanediyl, trimethylcyclohexanediyl, norbornanediyl, [1-3]diazetidine-2,4-dione-1,3-diyl, 3-(6-isocyanatohexyl)-biuret-1,5-diyl or 5-(6-isocyanatohexyl)-[1,3,5]triazinan-2,4,6-trion-1,3-diyl; or $R_{30}$ and $R_{31}$ together with the group —N-L—X form cyclic structures selected from

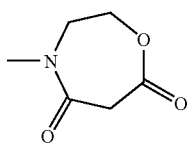 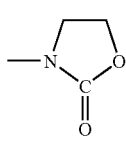 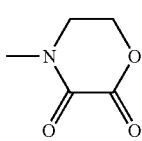

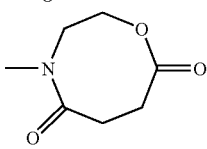 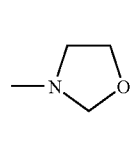 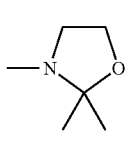

-continued

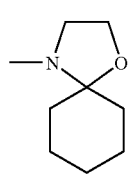 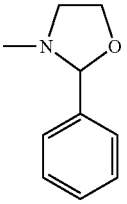 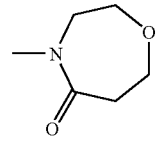

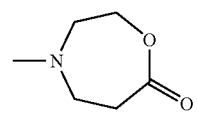 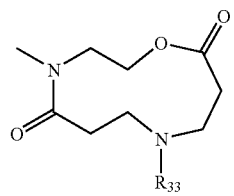

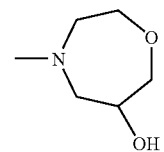

$R_{32}$ is hydrogen, $C_1$-$C_{18}$-alkyl or $C_1$-$C_{18}$-alkyl substituted by hydroxy, $C_1$-$C_4$-alkoxy, —O—CO—($C_1$-$C_4$-alkyl), —CN and/or —COO($C_1$-$C_4$-alkyl); $C_3$-$C_{18}$-alkenyl, $C_5$-$C_{12}$-cycloalkyl, $C_7$-$C_9$-phenylalkyl, $C_2$-$C_{18}$-alkanoyl, benzoyl or norbornenoyl; or $C_2$-$C_{18}$-alkanoyl benzoyl or norbornenoyl substituted by hydroxy, $C_1$-$C_4$-alkoxy, —NR$_{33}$R$_{34}$, —SR$_{35}$, —COOH or —COO($C_1$-$C_4$-alkyl); or $C_3$-$C_5$-alkenoyl, —SO$_2$—($C_1$-$C_{12}$-alkyl) or —SO$_2$—($C_1$-$C_{12}$-alkylphenyl); or —CO—N—$C_1$-$C_{12}$-alkyl or —CO—NH—($C_0$-$C_{12}$-Alkylen)-N=C=O optionally interrupted by one or two phenylene, methylphenylene, phenylene-O-phenylene, cyclohexanediyl, methylcyclohexanediyl, trimethylcyclohexanediyl, norbornanediyl, [1-3]diazetidine-2,4-dione-1,3-diyl, 3-(6-isocyanatohexyl)-biuret-1,5-diyl or 5-(6-iso-cyanatohexyl)-[1,3,5]triazinan-2,4,6-trion-1,3-diyl;

$R_{33}$ and $R_{34}$ independently of one another are hydrogen, $C_1$-$C_{12}$-alkyl, $C_2$-$C_4$-hydroxy-alkyl, $C_3$-$C_{10}$-alkoxyalkyl, $C_3$-$C_5$-alkenyl, $C_5$-$C_{12}$-cycloalkyl, $C_7$-$C_9$-phenylalkyl, phenyl, $C_2$-$C_{18}$-alkanoyl or benzoyl; or $R_{33}$ and $R_{34}$ together are $C_2$-$C_8$-alkylene optionally interrupted by —O—, —S— or —NR$_{36}$—, or are $C_2$-$C_8$-alkylene optionally substituted by hydroxy, $C_1$-$C_4$-alkoxy, —O—CO—($C_1$-$C_4$-alkyl), or —COO($C_1$-$C_4$-alkyl);

$R_{35}$ is $C_1$-$C_{18}$-alkyl, hydroxyethyl, 2,3-dihydroxypropyl, cyclohexyl, benzyl, phenyl, $C_1$-$C_{12}$-alkylphenyl, —CH$_2$—COO($C_1$-$C_{18}$-alkyl), —CH$_2$CH$_2$—COO($C_1$-$C_{18}$-alkyl) or —CH(CH$_3$)—COO($C_1$-$C_{18}$-alkyl);

$R_{36}$ is hydrogen, $C_1$-$C_{12}$-alkyl optionally interrupted by one or more no adjacent —O-atoms, $C_3$-$C_5$-alkenyl, $C_7$-$C_9$-phenylalkyl, $C_1$-$C_4$-hydroxyalkyl, —CH$_2$CH$_2$CN, —CH$_2$CH$_2$COO($C_1$-$C_4$-alkyl), $C_2$-$C_{12}$-alkanoyl or benzoyl;

with the proviso that the following compounds are excluded:

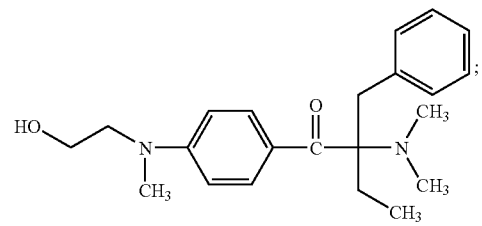

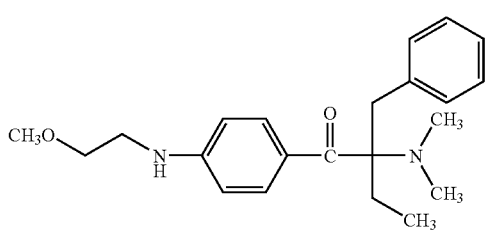

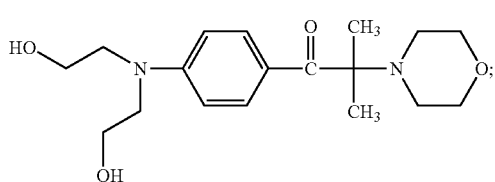

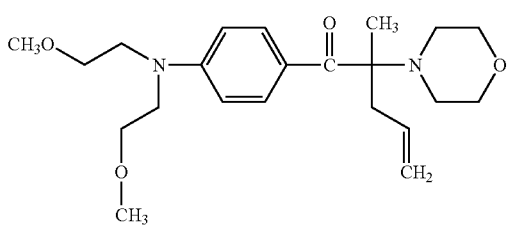

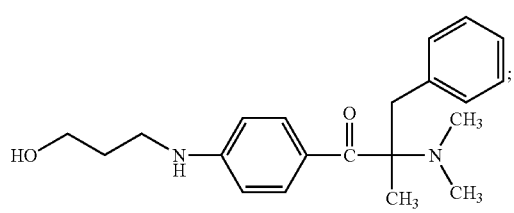

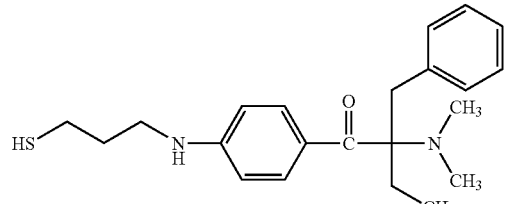

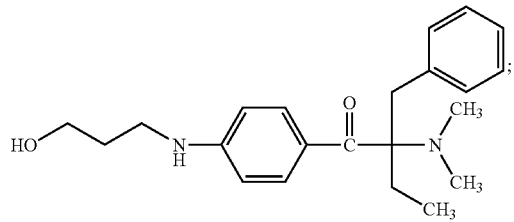

-continued

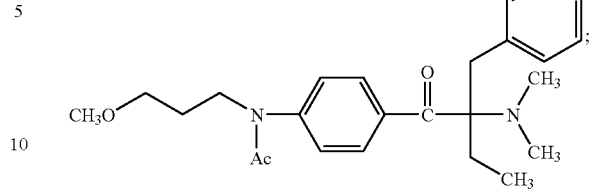

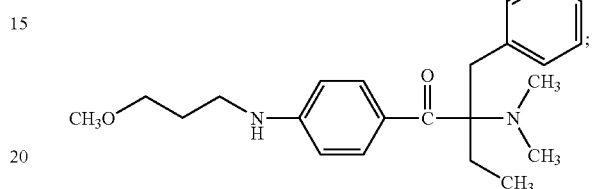

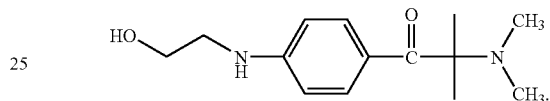

DEFINITIONS

Suitable linkers are linear or branched $C_2$-$C_{18}$-alkanediyl, or $C_2$-$C_{30}$-alkanediyl optionally interrupted by one or more not adjacent O-atoms, and/or optionally substituted by one or more hydroxy atoms. Other suitable linkers are 1,3-cyclohexanediyl, 1,4-cyclohexanediyl, 4-methyl-1,3-cyclohexanediyl or are selected form the following structures.

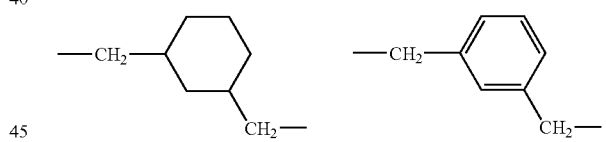

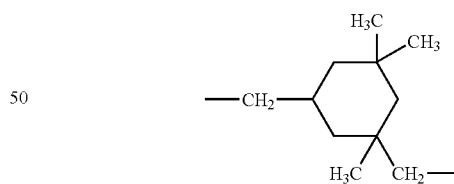

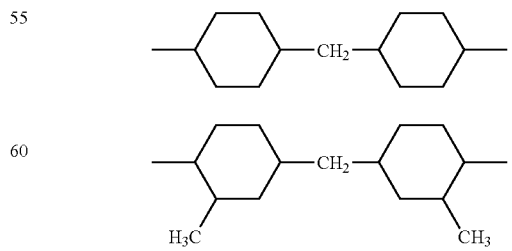

In the present description the term "alkyl", alone or in combination, signifies a straight-chain or branched-chain alkyl group; the upper and lower limits of the number of carbon atoms is given in each case.

The term "alkoxy", alone or in combination, signifies a group of the formula alkyl-O— in which the term "alkyl" has the previously given significance.

The term "alkenyl", alone or in combination, means a straight-chain or branched-chain hydrocarbon radial having one or more double bonds and containing a number of carbon atoms as given.

The term "alkanoyl", alone or in combination, means an acyl radical derived from an alkanecarboxylic acid wherein alkane means a radical as defined above for alkyl. Examples of alkanoyl radicals include acetyl, propionyl, butyryl, valeryl, 4-methylvaleryl, and the like.

The term "alkenoyl", alone or in combination, means an acyl radical derived from an alkenecarboxylic acid wherein alkene means a radical as defined above for alkenyl.

The term "alkadiene" alone or in combination includes compounds with at least two carbon to carbon double bonds and containing a number of carbon atoms as given.

All these compounds have at least one basic amino group and can therefore be converted into the corresponding salts by addition of acids. The acids can be inorganic or organic acids. Examples of such acids are HCl, HBr, $H_2SO_4$, $H_3PO_4$, mono- or polycarboxylic acids, for example, acetic acid, oleic acid, succinic acid, sebacic acid, tartaric acid or $CF_3COOH$, and sulfonic acids, for example, $CH_3SO_3H$.

Preferred Photoinitiators:

A compound of the formula I, wherein
n is 1 or 2;
L is a linker;
X is —O—, —S— or —$NR_{32}$—
Z is a direct bond;
$R_1$ is
  (a) linear or branched unsubstituted $C_1$-$C_{12}$-alkyl;
  (b) a radical of the formula;

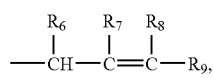

or
  (d) a radical of the formula

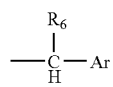

wherein Ar is phenyl, which is unsubstituted or substituted by one or more of the groups $NO_2$, —$N(R_{10})_2$, $C_1$-$C_4$-alkyl, $C_1$-$C_4$-alkoxy, $C_1$-$C_4$-alkylthio, phenoxy;
$R_2$ if n is 1, independently of $R_1$ has one of the meanings of $R_1$;
$R_2$ if n is 2, is $C_2$-$C_8$alkylene;
$R_3$ is $C_1$-$C_4$-alkyl, $C_2$-$C_4$-alkyl substituted by hydroxy, $C_1$-$C_4$-alkoxy; $C_3$-$C_5$-alkenyl;
$R_4$ independently of $R_3$ has one of the meanings of $R_3$; or $R_4$ together with $R_3$ is $C_4$-$C_5$-alkylene that may be interrupted by —O—, —$N(R_{13})$—;
$R_5$ is hydrogen;

$R_6$, $R_7$, $R_8$ and $R_9$ independently of each other are hydrogen or methyl;
$R_{10}$ is hydrogen, $C_1$-$C_4$-alkyl or $C_3$-$C_5$-alkenyl;
$R_{13}$ is hydrogen or $C_1$-$C_4$-alkyl;
$R_{30}$ and $R_{31}$ independently of one another are hydrogen, $C_1$-$C_{12}$-alkyl; or $C_2$-$C_6$-alkyl substituted by hydroxy, $C_1$-$C_4$-alkoxy, —O—CO—($C_1$-$C_4$-alkyl), or —COO($C_1$-$C_4$-alkyl); allyl, cyclohexyl or $C_7$-$C_9$-phenylalkyl; or $C_2$-$C_{12}$-alkanoyl, benzoyl or norbornenoyl; or $C_2$-$C_{12}$-alkanoyl, benzoyl or norbornenoyl substituted by $C_1$-$C_4$-alkoxy, —COOH or —COO($C_1$-$C_4$-alkyl); or $C_3$-$C_5$-alkenoyl; or —CO—NH—$C_1$-$C_{12}$-alkyl or —CO—NH—($C_0$-$C_{12}$-alkylen)-N=C=O, optionally interrupted by one or two phenylene, methylphenylene, phenylene-O-phenylene, cyclohexanediyl, methylcyclohexanediyl, trimethylcyclohexanediyl, norbornanediyl, [1-3]diazetidine-2,4-dione-1,3-diyl, 3-(6-isocyanatohexyl)-biuret-1,5-diyl or 5-(6-Isocyanatohexyl)-[1,3,5]triazinane-2,4,6-trione-1,3-diyl;
$R_{32}$ is hydrogen or $C_1$-$C_{12}$-alkyl.

Especially preferred are compounds of the formula I, wherein
n is 1 or 2;
L is linear or branched $C_2$-$C_{18}$-alkanediyl;
X is —O—;
Z is a direct bond;
$R_1$ is
  (a) linear or branched unsubstituted $C_1$-$C_3$-alkyl;
  (b) a radical of the formula;

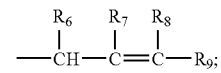

(d) a radical of the formula

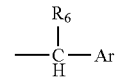

where Ar is phenyl, which is unsubstituted or substituted by $CH_3$—$NO_2$ or —$N(R_{10})_2$;
$R_2$ if n is 1, independently of $R_1$ has one of the meanings of $R_1$;
$R_2$ if n is 2, is $C_2$-$C_8$alkylene;
$R_3$ is methyl,
$R_4$ is methyl or $R_4$ together with $R_3$ is $C_5$-alkylene that is interrupted by —O—;
$R_5$ is hydrogen;
$R_6$, $R_7$, $R_8$ and $R_9$ are hydrogen;
$R_{10}$ is hydrogen;
$R_{30}$ and $R_{31}$ independently of one another are hydrogen, $C_1$-$C_{12}$-alkyl; or $C_2$-$C_6$-alkyl substituted by hydroxy; $C_1$-$C_4$-alkoxy, —O—CO—($C_1$-$C_4$-alkyl), or $C_3$-$C_5$-alkenoyl.

An especially high reactivity is obtained by photoinitiators of the formula I, wherein $R_1$ is benzyl, 4-aminobenzyl, propyl or allyl and $R_2$ is ethyl or is $C_2$-$C_8$alkylene.

Examples

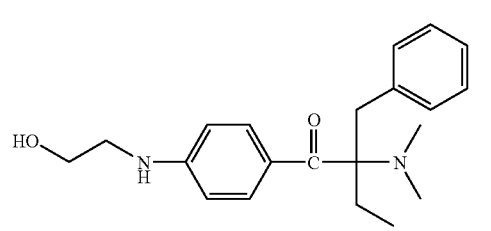

2-benzyl-1-[4-(2-hydroxyethylamino)phenyl]-
2-dimethylamino-1-butanone

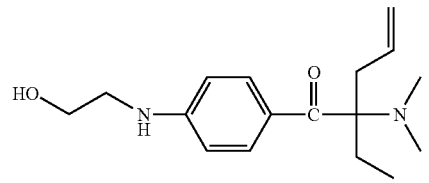

2-ethyl-1-[4-(2-hydroxyethylamino)phenyl]-
2-dimethylamino-1-pent-4-en-1-one

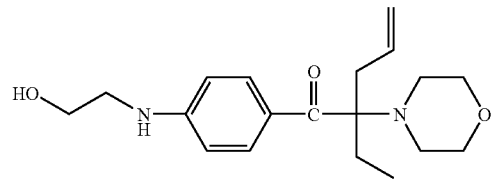

2-ethyl-1-[4-(2-hydroxyethylamino)phenyl]-
2-(morpholin-4-yl)-1-pent-4-en-1-one

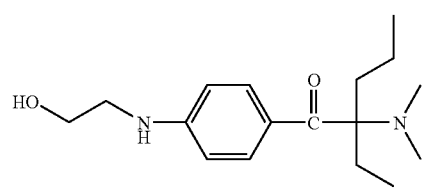

2-ethyl-1-[4-(2-hydroxyethylamino)phenyl]-
2-dimethylamino-1-pentan-1-one

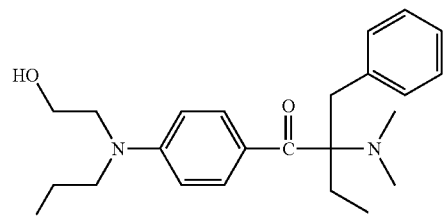

2-benzyl-1-{[4-[bis(2-
hydroxyethy)amino]phenyl}-2-
dimethylamino-1-butanone

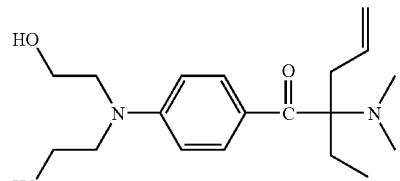

2-dimethylamino-1-{[4-[bis(2-
hydroxyethy)amino]-phenyl}-2-ethyl-1-pent-
4-en-1-one

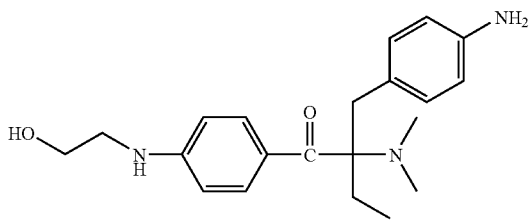

2-[(4-aminophenyl)methyl]-1-[4-(2-
hydroxyethylamino)phenyl]-2-
dimethylamino-1-butanone

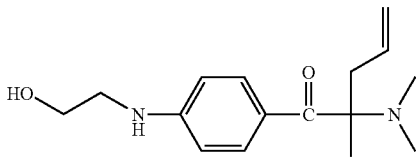

1-[4-(2-hydroxyethylamino)phenyl]-2-methyl-
2-dimethylamino-1-pent-4-en-1-one

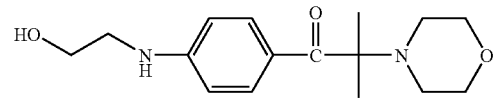

1-[4-(2-hydroxyethylamino)phenyl]-2-methyl-
2-(morpholin-4-yl)-1-propanone

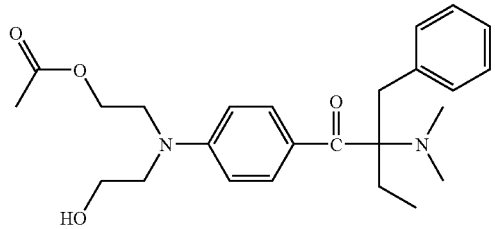

2-benzyl-2-dimethylamino-1-{[4-(2-
acetoxyethyl-2-hydroxyethyl-amino)-
phenyl}-1-butanone

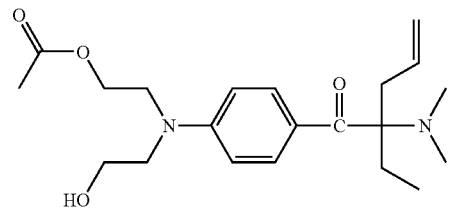

2-dimethylamino-1-{[4-(2-acetoxyethyl-2-
hydroxyethyl-amino)-phenyl}-2-ethyl-1-pent-
4-en-1-one

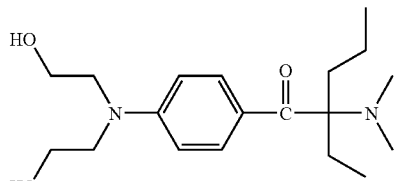

2-dimethylamino-1-{[4-[bis(2-
hydroxyethy)amino]-phenyl}-2-ethyl-1-
pentan-1-one -continued

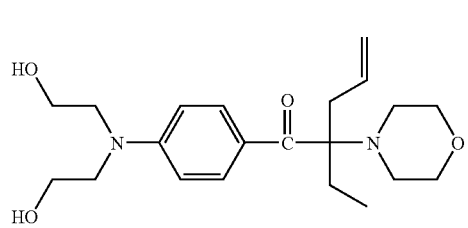
1-{[4-[bis(2-hydroxyethyl)amino]-phenyl}-2-
ethyl-2-morpholin-4-yl)-1-pent-4-en-1-one

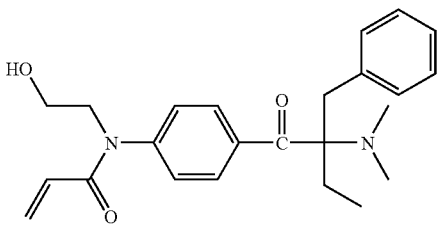
2-benzyl-1-{4-[(2-hydroxyethyl)-acryloyl-
amino]phenyl}-2-dimethylamino-1-butanone

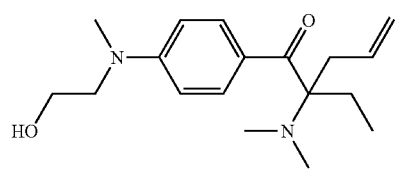
2-dimethylamino-2-ethyl-1-{4-[(2-hydroxy-
ethyl)-methyl-amino]-phenyl}-pent-4-en-1-one

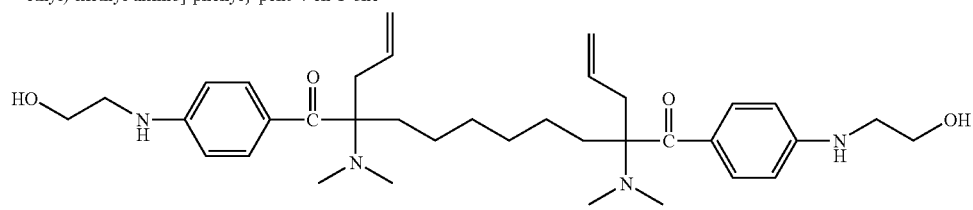
2,8-diallyl-2,8-bis-dimethylamino-1,9-bis-[4-
(2-hydroxy-ethylamino)-phenyl]-nonane-1,9-dione

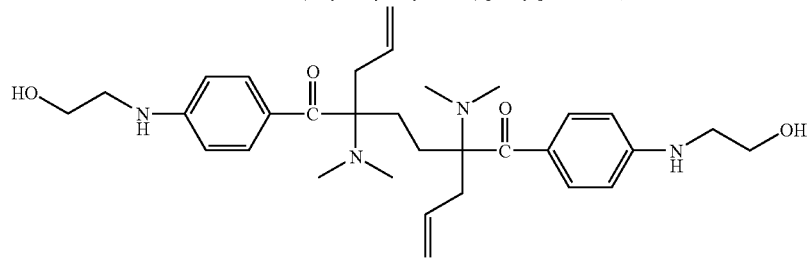
2,5-diallyl-2,5-bis-dimethylamino-1,6-bis-[4-
(2-hydroxy-ethylamino)-phenyl]-hexan-1,6-dione

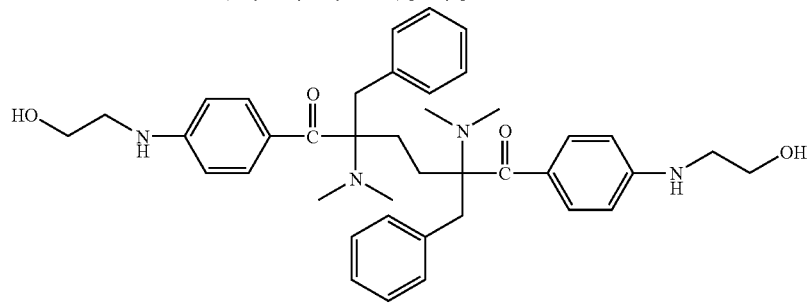
2,5-dibenzyl-2,5-bis-dimethylamino-1,6-bis-
[4-(2-hydroxy-ethylamino)-phenyl]-hexan-1,6-dione Preparation of the Novel Photoinitiators:

The compounds of formula I can be prepared starting from known ketones by C-alkylation or C-benzylation. The amino group —NR$_3$R$_4$ is preferably introduced before the alkylation or benzylation. The synthesis is carried out in the sequence of reaction steps as described in EPO 284561B1 or U.S. Pat. No. 5,077,402.

For example, a halogeno aryl ketone such as e.g. 4-fluorobutyrophenone can be used as starting ketone. After bromination the dimethylamino group is introduced followed by a benzylation reaction. The halogen is then replaced by ethanolamine in a nucleophilic replacement reaction. The following key compound is obtained.

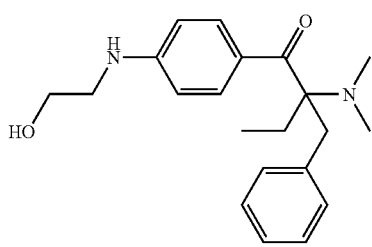

The above key compound (Ex. 1, named Educt E) or the compounds according to Examples 2-18 can be further reacted with reagents such as those listed below. The radical R in the following lists may carry 1-n of the functional groups indicated. If n>1, the polyfunctional reagent may be reacted with 1-n equivalents of the educt (e.g. E).

Reagents with which E can be reacted are:

1) acids, acid halides, linear or branched acid anhydrides, COCl$_2$ or lactones Educt E and R—COOH, R—COCl, R—CO—O—CO—R,

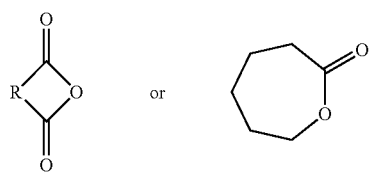

Amides (A), esters (B) or amide-ester compounds (AB), (ABR) are obtained.

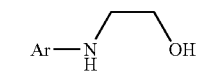
E

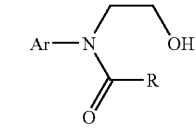
A

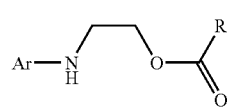
B

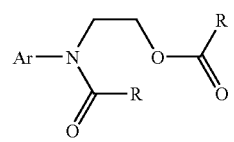
AB

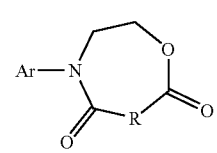
ABR

Examples of cyclic amide-ester compounds (ABR) are:

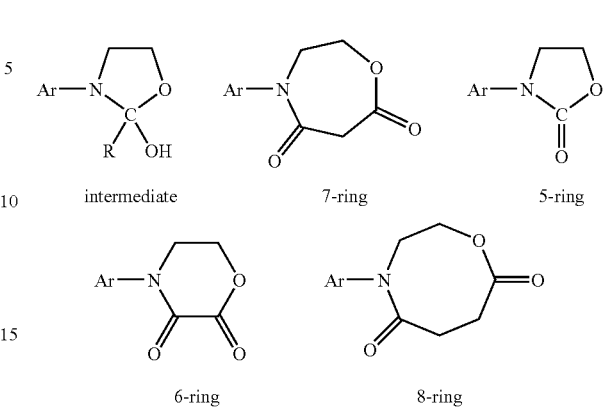

2) Reaction with aldehydes or ketones

Educt E and R—CHO, R—CO—R

2-Oxazolidine compounds (A) or 2-oxazolidine compounds (B) and further cyclic products are obtained.

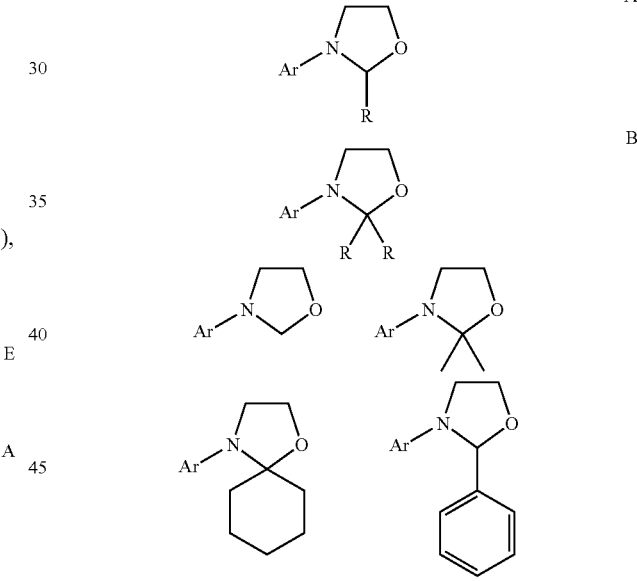

3) Reaction with isocyanates

Educt E and R—N=C=O

Urea derivatives (A) or urethane derivatives (B) or urea-urethane derivatives (AB) or cyclic urea-urethane derivatives (ABR) are obtained.

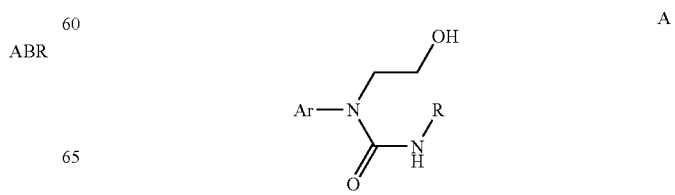
A

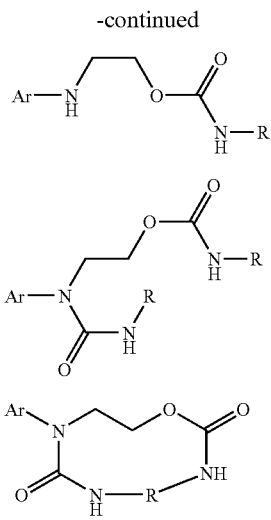

4) Reaction with sulfonic acid chloride.

Educt E and R—SO$_2$—Cl

Sulfonamide derivatives (A), sulfonic acid esters (B) or sulfonamide-sulfonic acid derivatives (AB) are obtained.

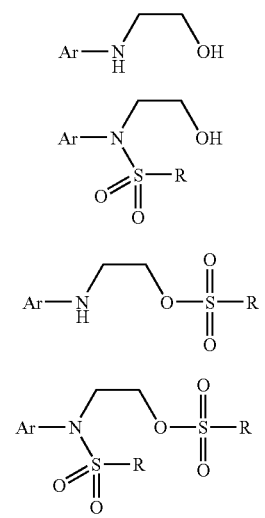

5) Alkylation, reaction with R—X

Educt E and R-halogen or R—O—SO$_2$—R' or other known alkylations agents,

Amines (A), ethers (B) or amine-ether derivatives (AB) are obtained.

Examples are:

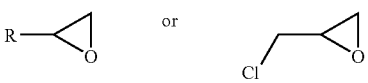

The compounds thus obtained can in turn be used as starting materials E' for as described under 1), 2), 3), 4), 6), 7) or 8)

6) Reaction with epoxides or epichlorhydrine

Educt E and

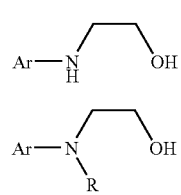

Hydroxyalkylamine compounds (A) or hydroxyalkylether compounds (B) or hydroxyalkylamine-hydroxyalkylether-compounds (AB) or cyclic hydroxyalkylamine-hydroxyalkylether-compounds (ABR) are obtained.

-continued

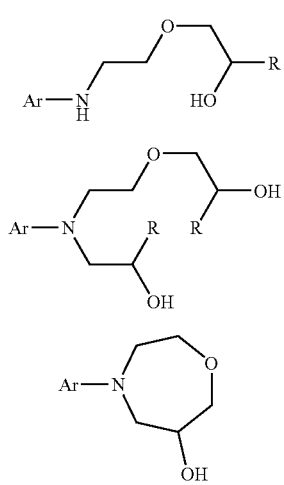

7) Reaction with acrylates or methacrylates

Educt E and $CH_2=CH-CO-OH$ or $CH_2=C(CH_3)-CO-OH$ or with the corresponding acid chlorides.

Acrylamides (A) or acrylester (B) or amide-ester-compounds (AB) are obtained.

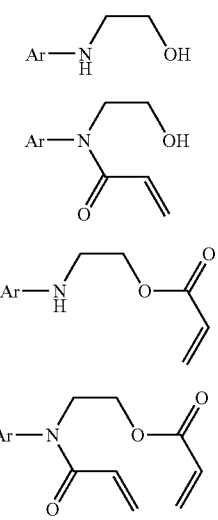

Examples for cyclic compounds obtained from the above compounds by intramolecular Michael addition reaction.

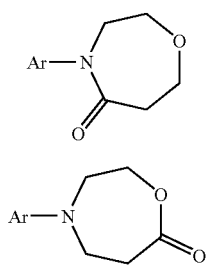

-continued

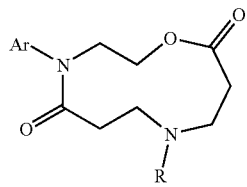

7a) The acrylamides (A), acrylester (B) or amide-ester compounds (AB) can be reacted with amines to obtain

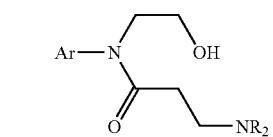

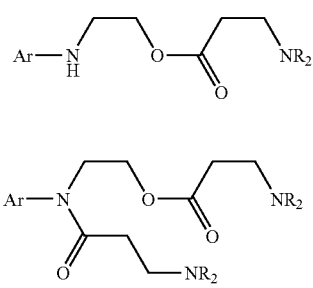

7b) The acrylamides (A), acrylester (B) or amide-ester compounds (AB) can be reacted with alcohols to obtain

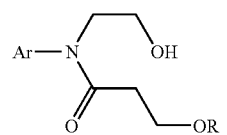

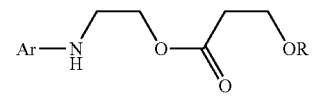

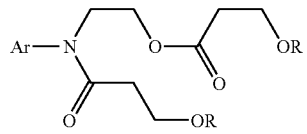

7c) The acrylamides (A), acrylester (B) or amide-ester compounds (AB) can be reacted with thioalcohols to obtain
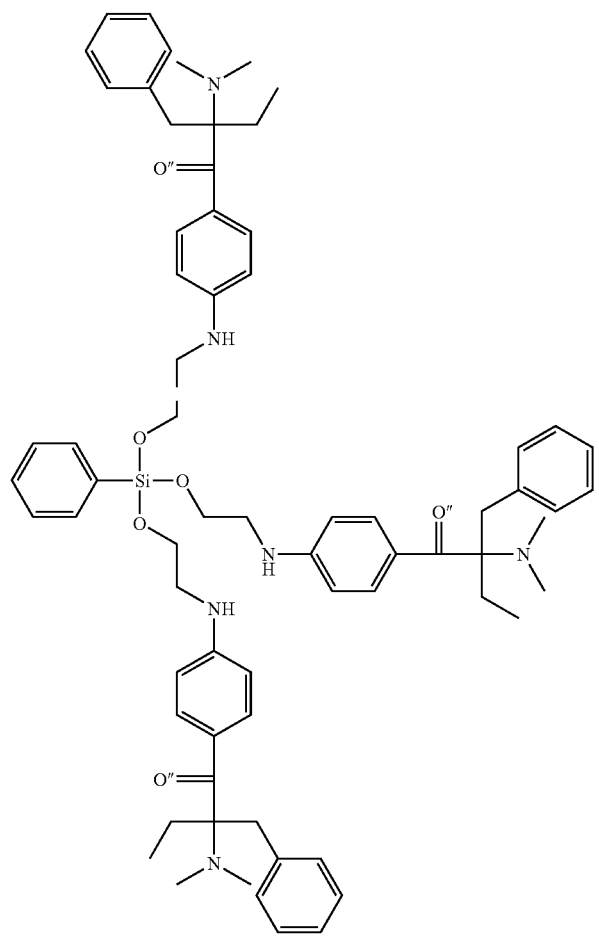
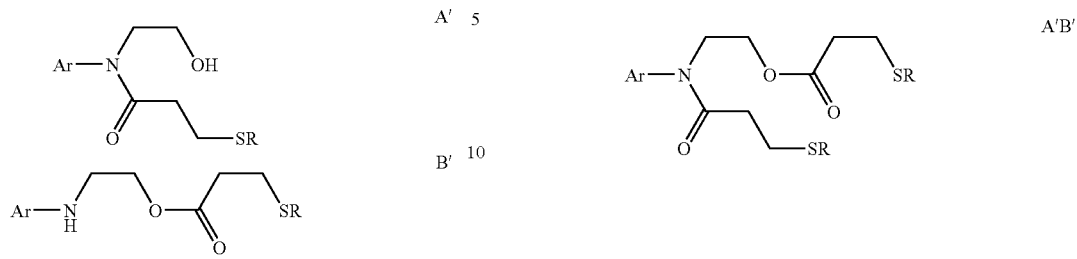
Examples of multifunctional photoinitiators are:
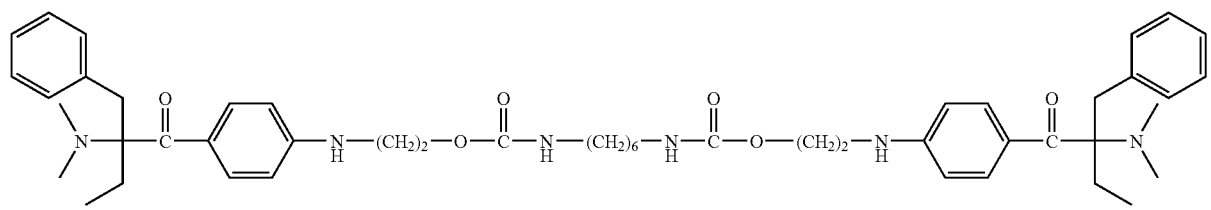

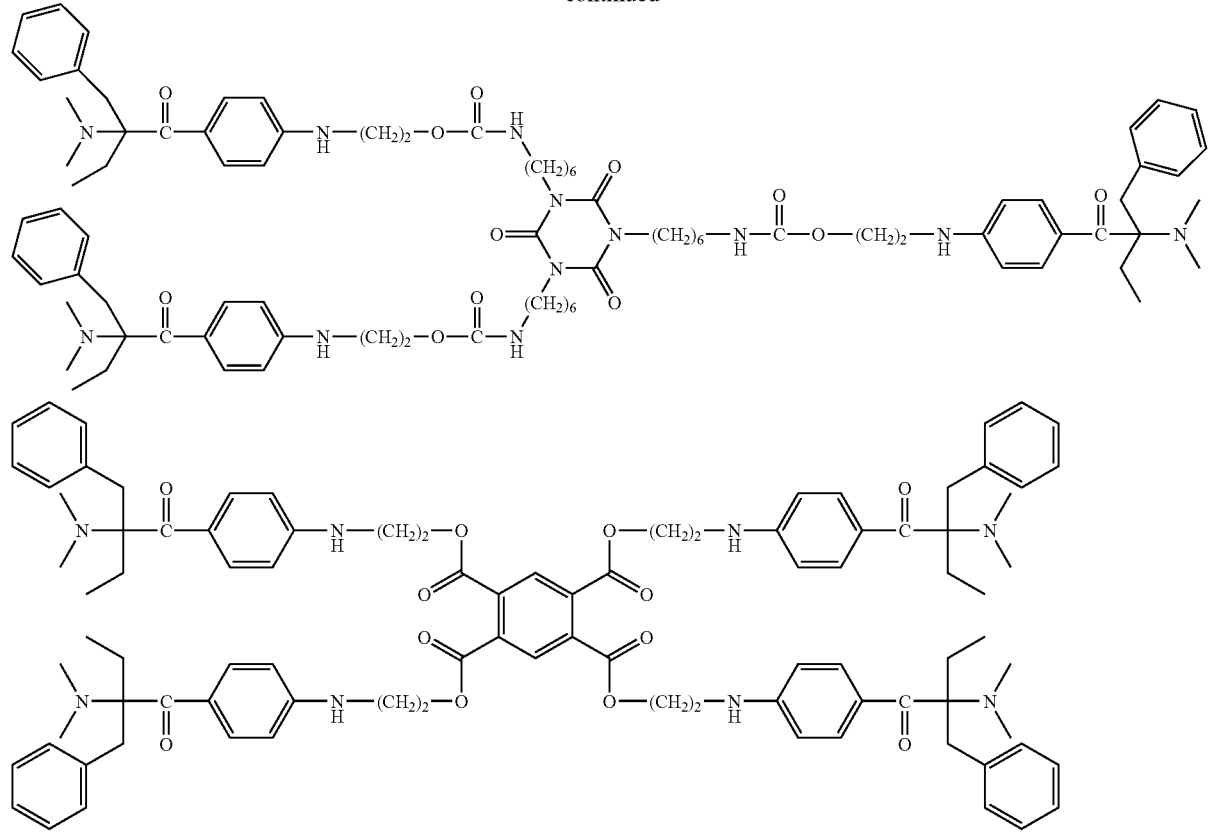
Dimeric or Oligomeric Products:
The compounds of Examples 1-18 may be reacted with following acid halides, acid anhydrides, di- or poly carboxylic acids, di- or polyaldehydes, di- or oligoisocyanates, di- or oligoepoxides, di- or polyamines, di- or oligoalcohols, di- or polythiols to obtain di- or oligomeric product.
Technical important acid chlorides:
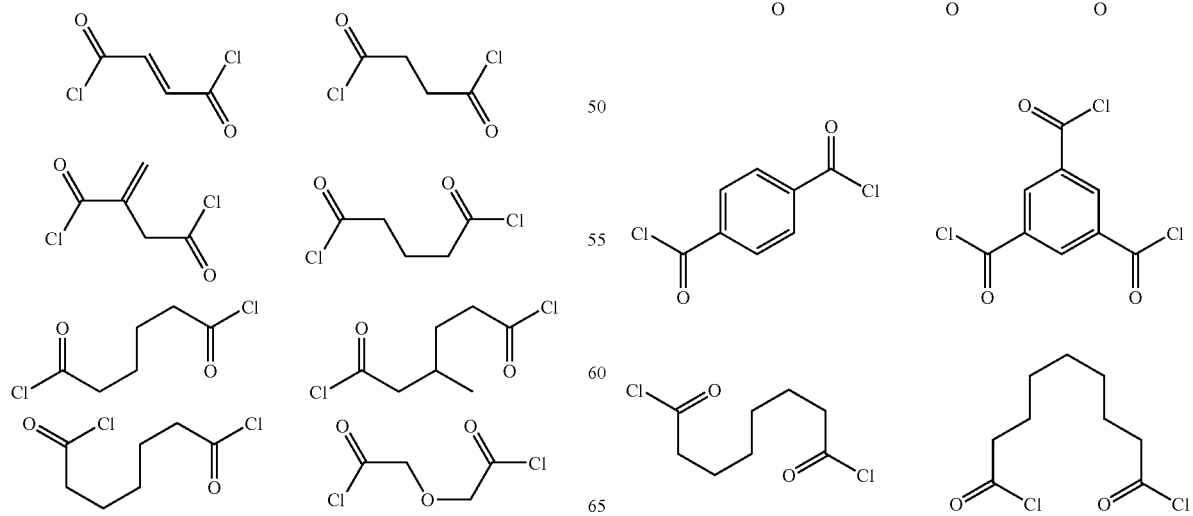

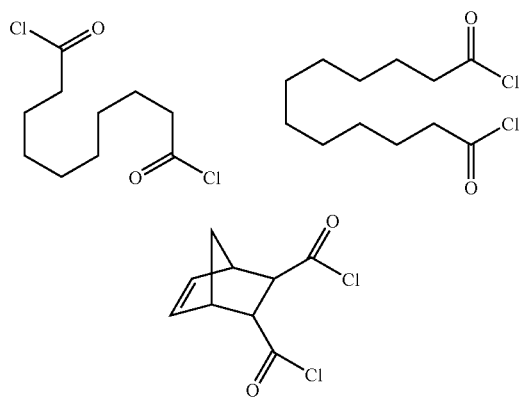
Technical important acid anhydrides:
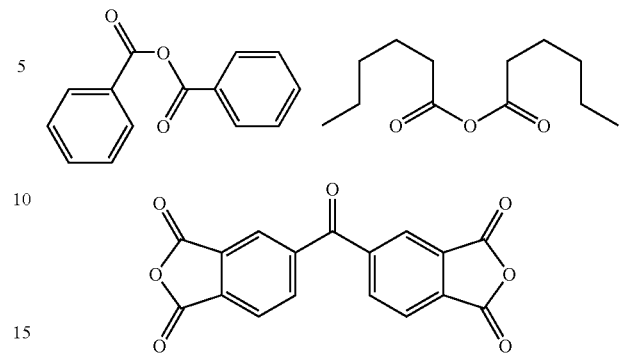
Technical important di- or polycarboxylic acids
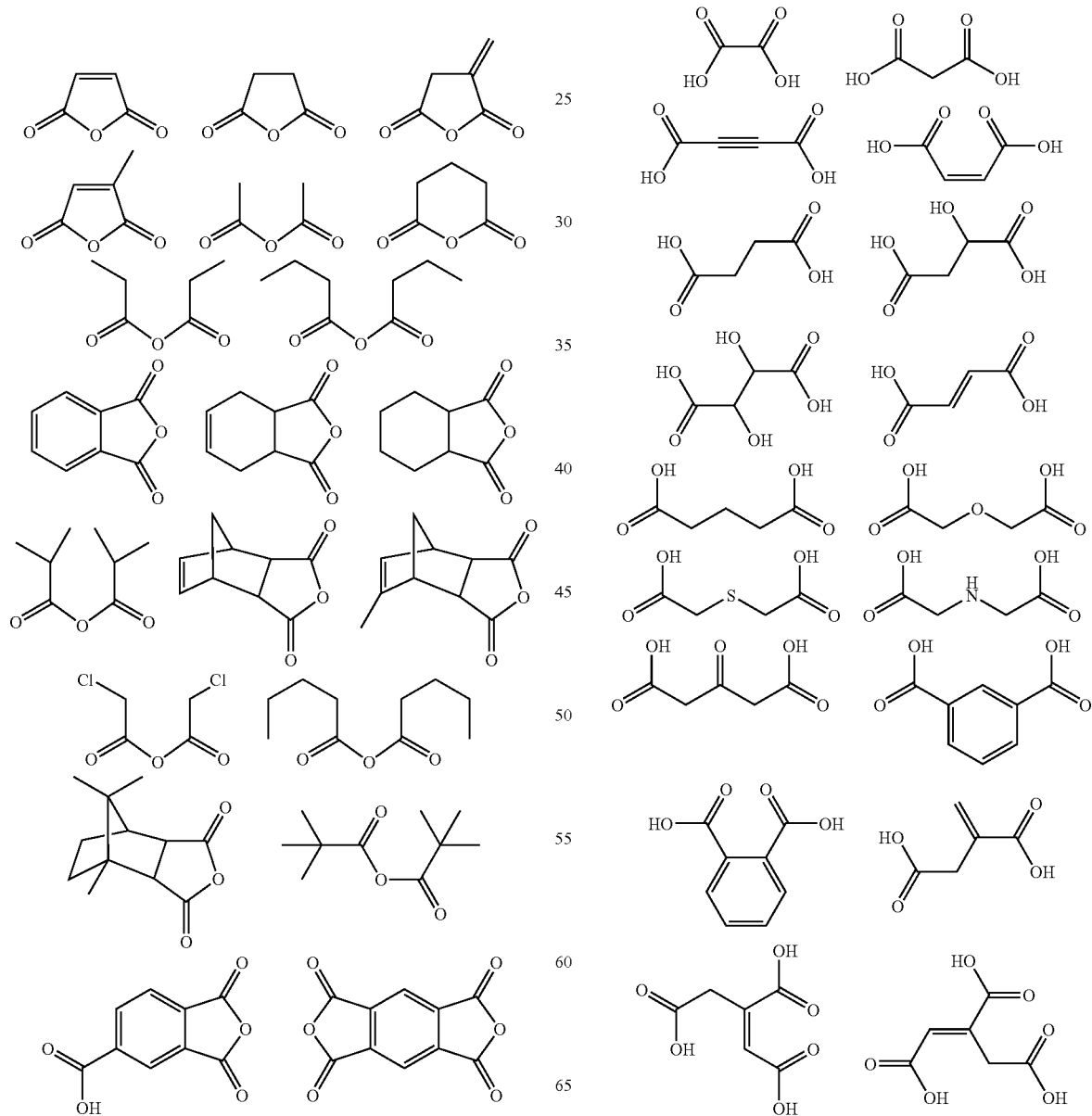

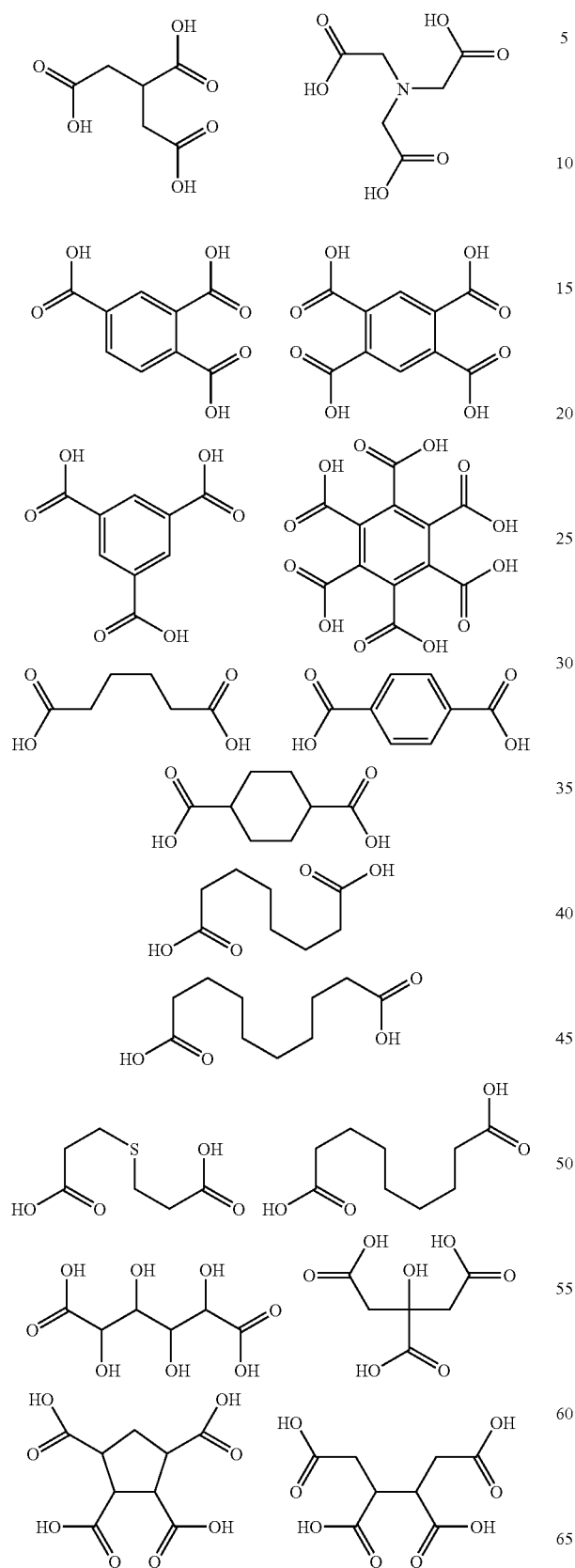
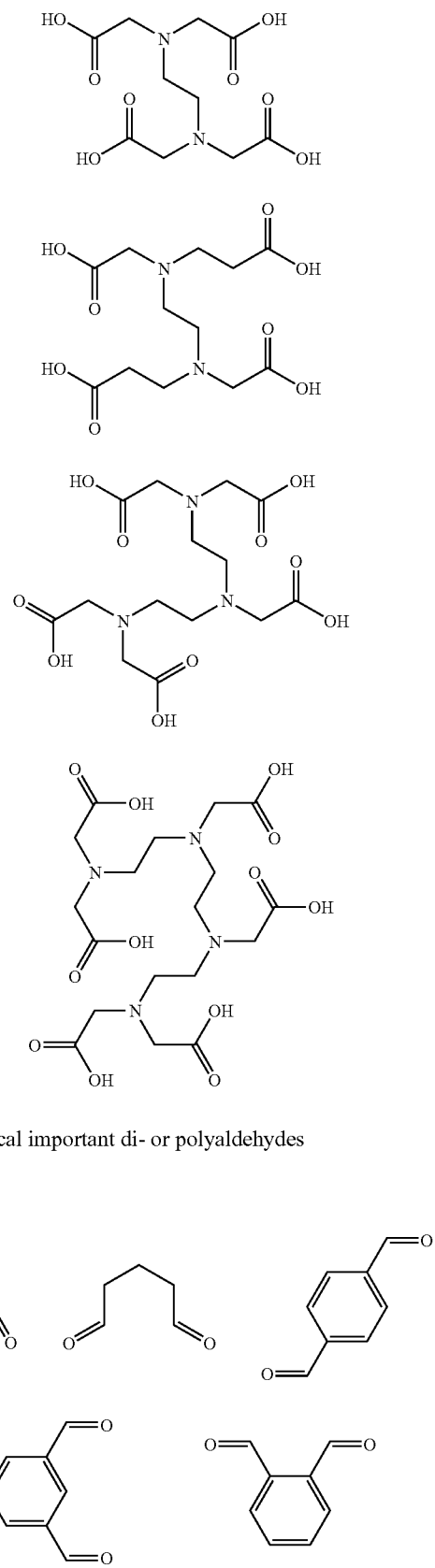
Technical important di- or polyaldehydes

Technical important di- or polyisocyanates
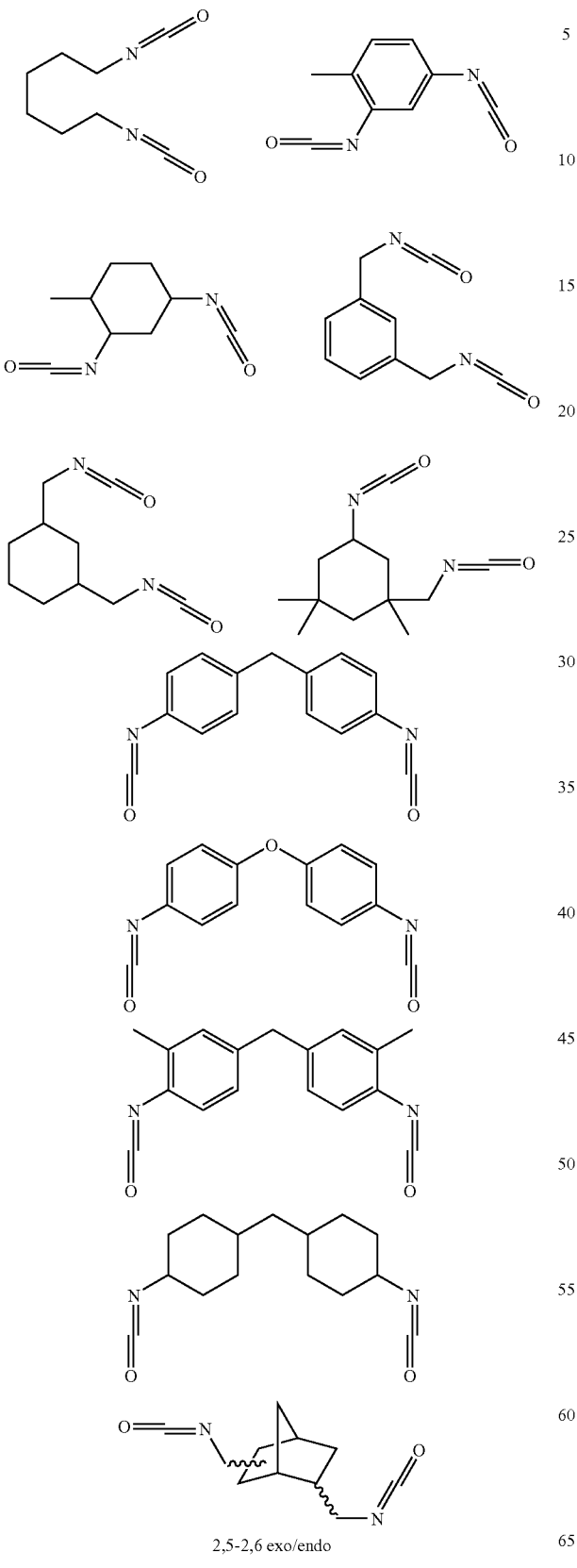
2,5-2,6 exo/endo
-continued
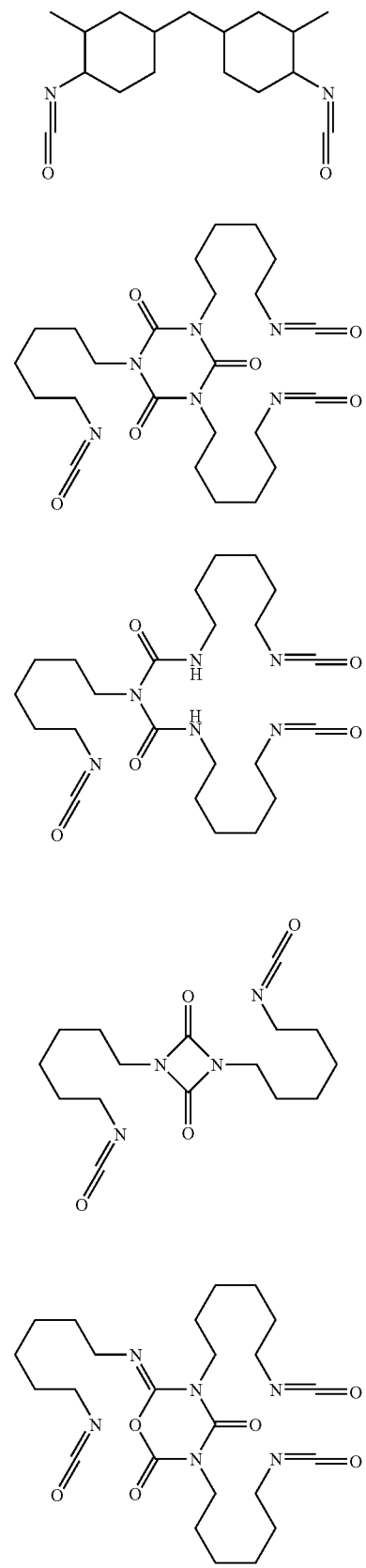

-continued
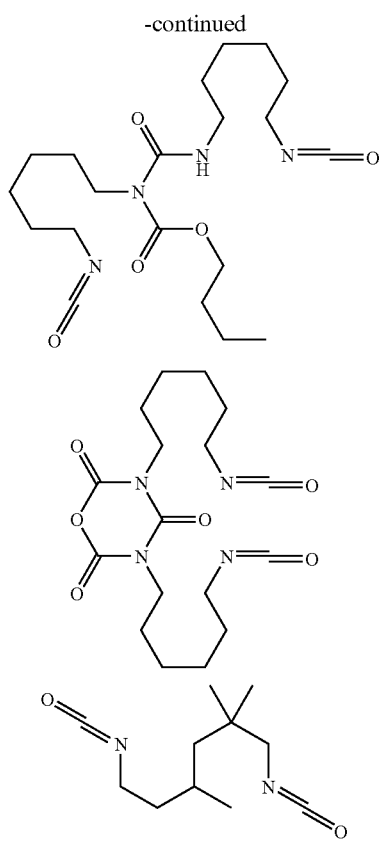
Technical important di- or polyepoxides:
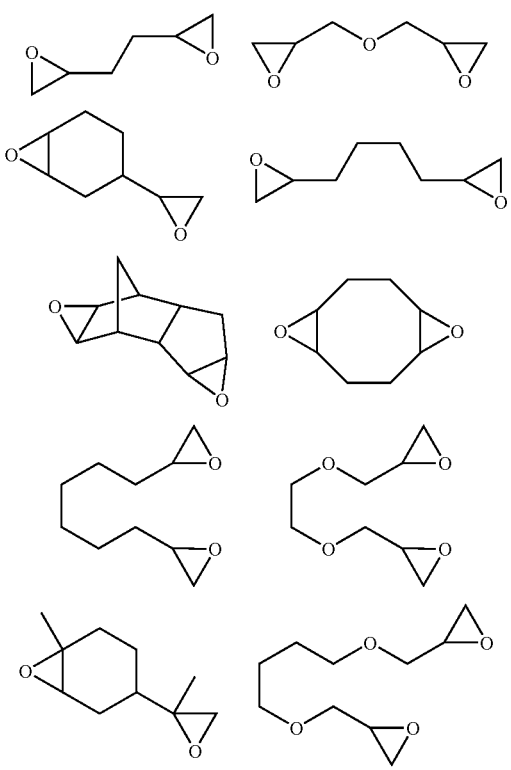
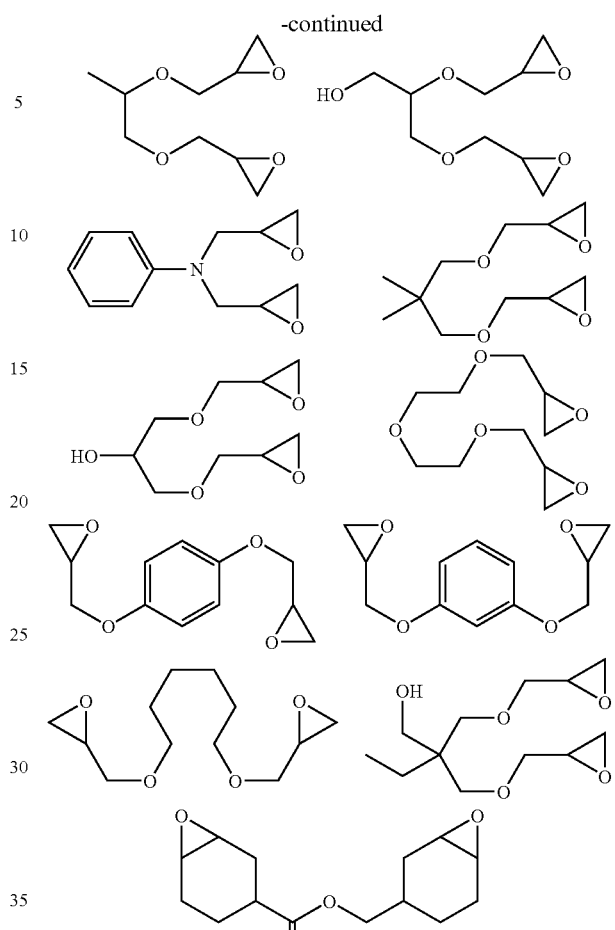

31
-continued
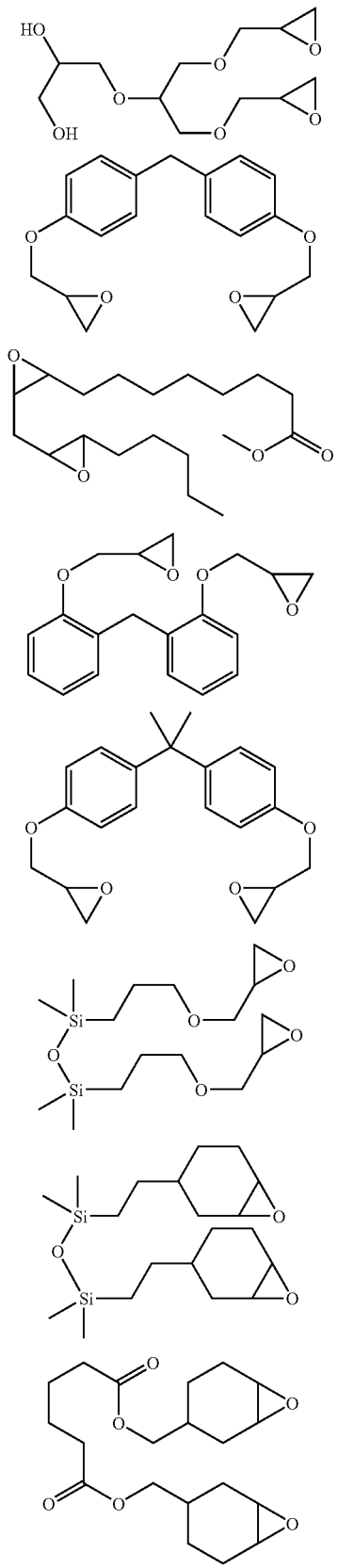
32
-continued
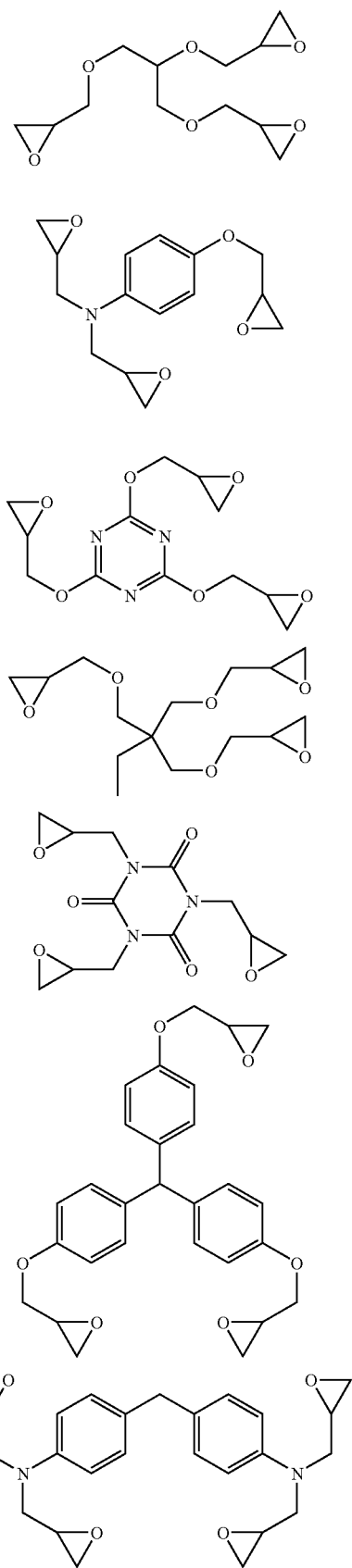

-continued
Technical important di- or polyamines:
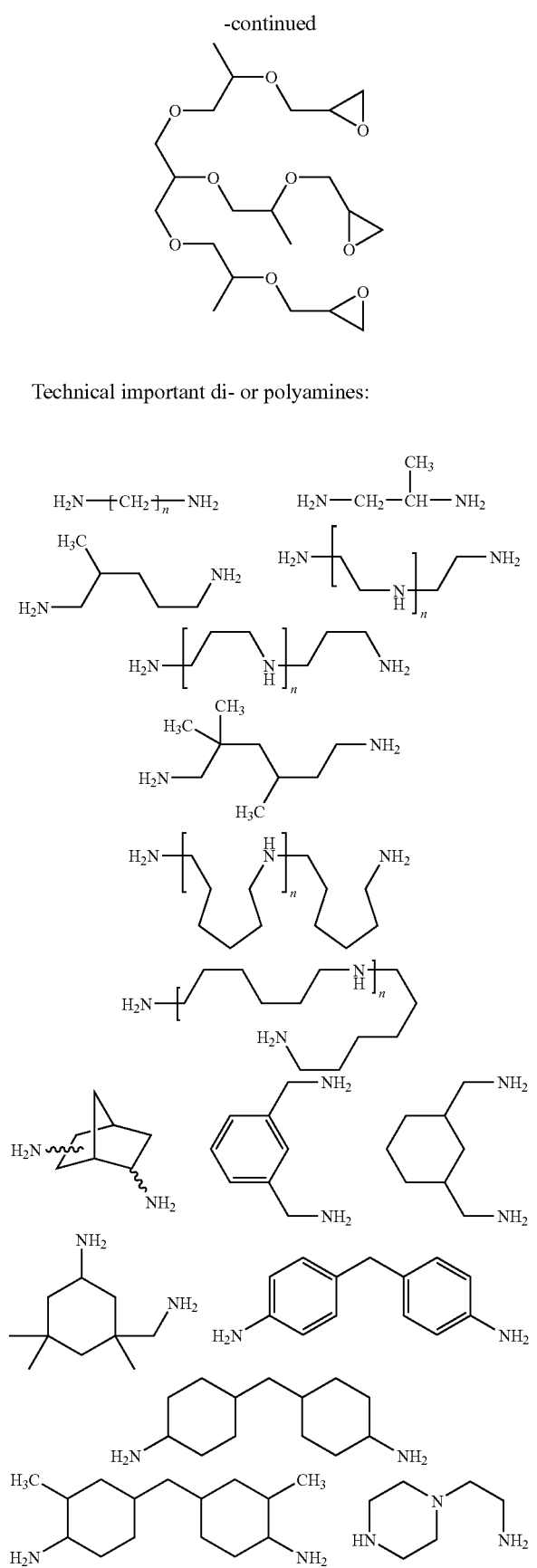
-continued
Technical important di- or polythiols:
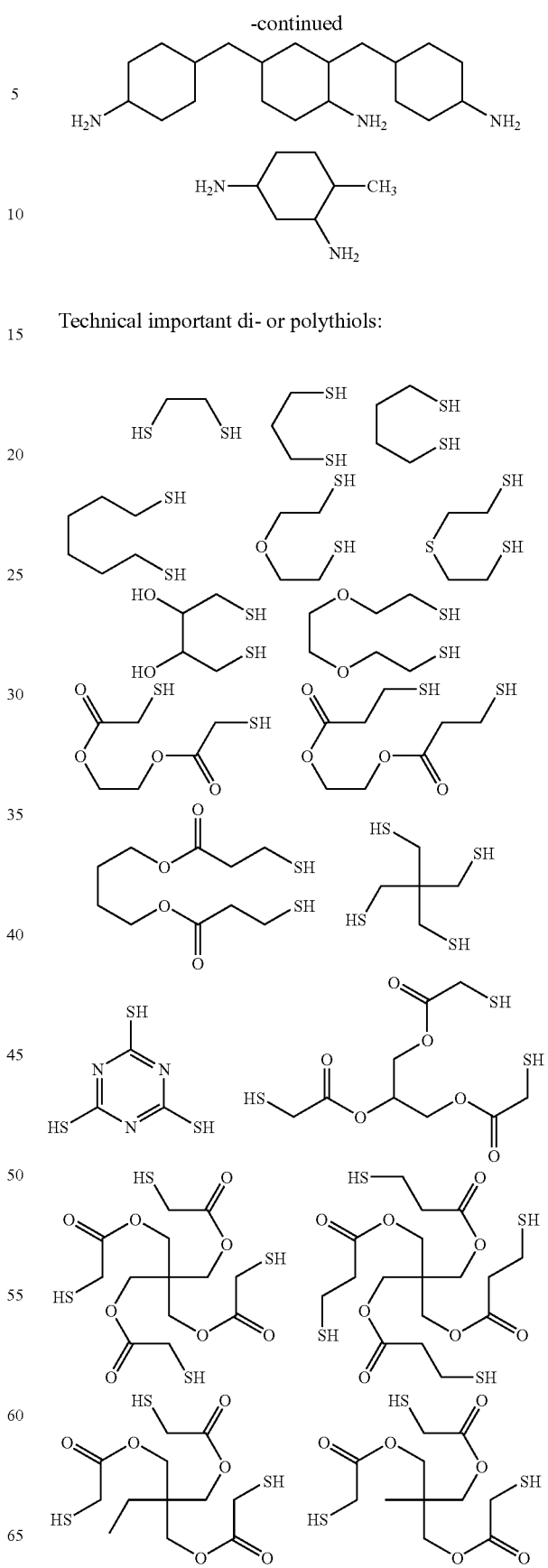

-continued
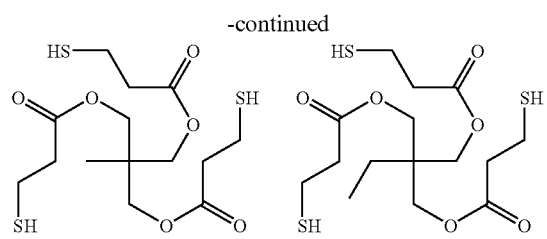
Technical important di- or polyalcohols:
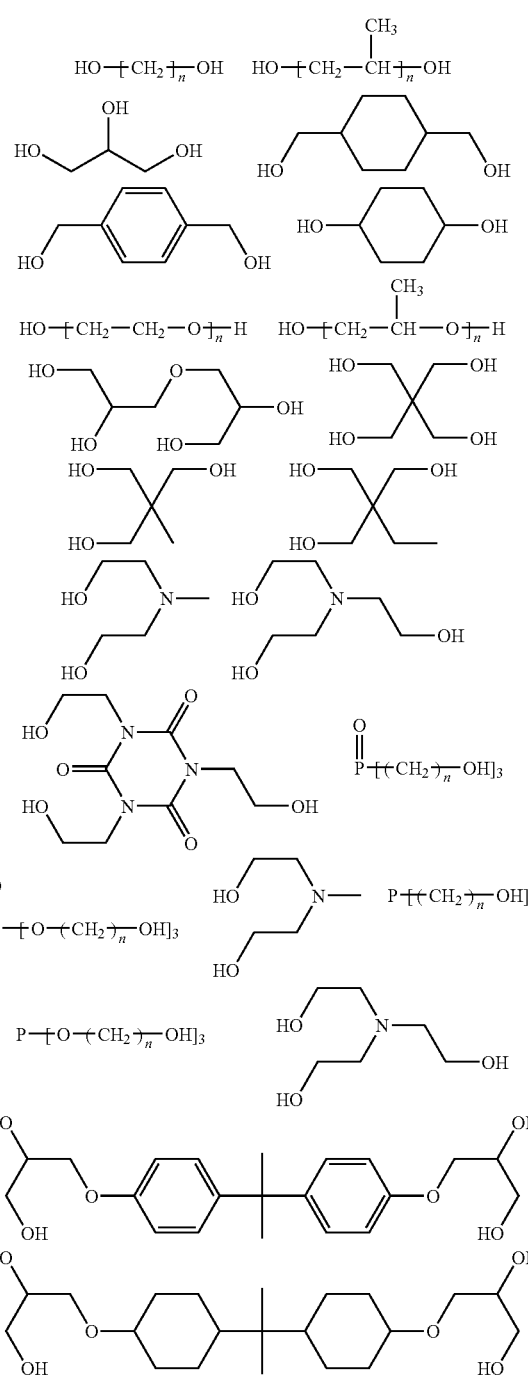
-continued
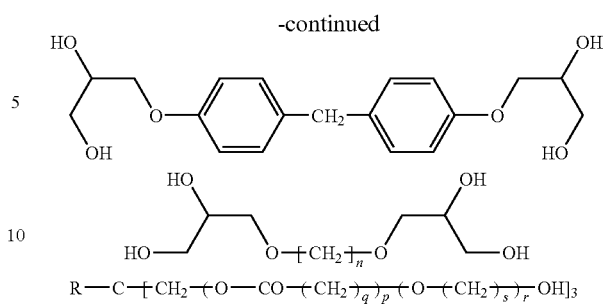
Si-containing di- and oligoalcohols.
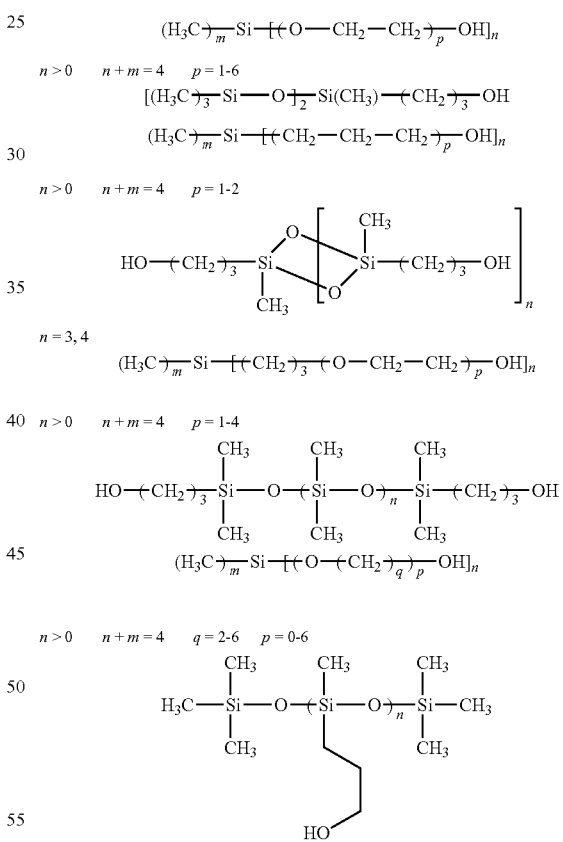
Si-containing di- and oligo-lactone-derivates
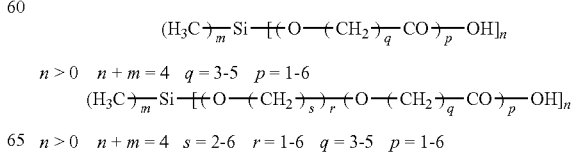

Linking moieties between initiator and Si

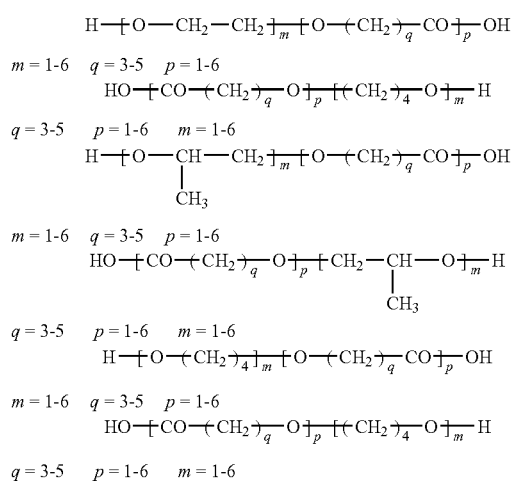

$m = 1\text{-}6 \quad q = 3\text{-}5 \quad p = 1\text{-}6$ $q = 3\text{-}5 \quad p = 1\text{-}6 \quad m = 1\text{-}6$ $m = 1\text{-}6 \quad q = 3\text{-}5 \quad p = 1\text{-}6$ $q = 3\text{-}5 \quad p = 1\text{-}6 \quad m = 1\text{-}6$ $m = 1\text{-}6 \quad q = 3\text{-}5 \quad p = 1\text{-}6$ $q = 3\text{-}5 \quad p = 1\text{-}6 \quad m = 1\text{-}6$ $q = 3\text{-}5 \quad p = 1\text{-}6 \quad m = 1\text{-}6$ Examples for the alkylation at the N-atom are:

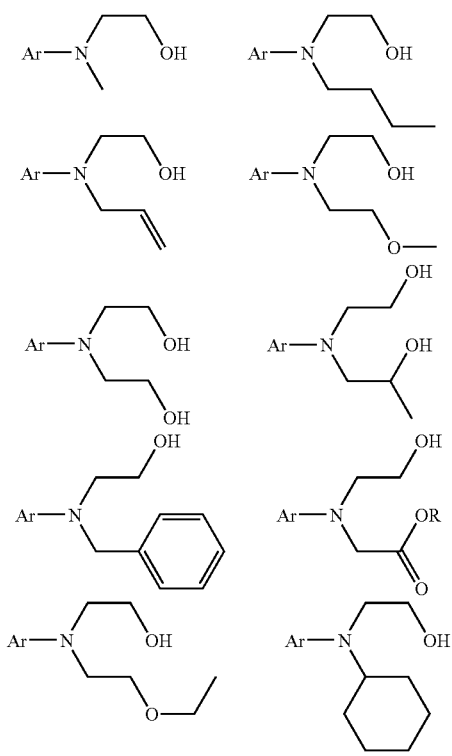

According to the invention, the compounds of the formula I can be used as photoinitiators for photopolymerization of ethylenically unsaturated compounds or mixtures containing such compounds.

Thus, the invention relates also to a composition comprising (A) at least one ethylenically unsaturated compound,
(B) a photoinitiator of formula I as defined above.

Suitable Ethylenically Unsaturated Compounds (A)

Suitable compounds with olefinic double bonds are all compounds that can be crosslinked by free radical polymerization of the double bond. The ethylenically unsaturated compound may be a monomer, an oligomer or a prepolymer, a mixture thereof or a copolymer thereof.

Monomers suitable for free-radical polymerization are, for example, ethylenically unsaturated polymerizable monomers selected from the group consisting of (meth)acrylates, alkenes, conjugated dienes, styrenes, acrolein, vinyl acetate, vinylpyrrolidone, vinylimidazole, maleic anhydride, fumaric anhydride, (meth)acrylic acid, (meth)acrylic acid derivatives such as esters and amides, vinyl halides and vinylidene halides. Preferred are compounds having (meth)acryloyl, vinyl and/or maleinate groups. Especially preferred are (meth)acrylates.

Compounds which contain free-radically polymerizable double bonds in the form of the preferred (meth)acryloyl groups may be produced in accordance with conventional methods. This may proceed, for example, by: transesterifying OH-functional resins, such as OH-functional polyesters, polyacrylates, polyurethanes, polyethers or epoxy resins, with alkyl esters of (meth)acrylic acid; esterifying the stated OH-functional resins with (meth)acrylic acid; reacting the stated OH-functional resins with isocyanate-functional (meth)acrylates; reacting acid-functional resins, such as polyesters, polyacrylates, polyurethanes with epoxy-functional (meth)acrylates; reacting epoxy-functional resins, such as polyesters, poly-acrylates, epoxy resins with (meth)acrylic acid. These production methods stated by way of example are described in the literature and known to the person skilled in the art.

According to the invention, the compounds of the formula I can be used as photoinitiators for photopolymerization of ethylenically unsaturated compounds or mixtures containing such compounds.

Thus, the invention relates also to a composition comprising (A) at least one ethylenically unsaturated compound,
(B) a photoinitiator of formula I as defined above.

Suitable Ethylenically Unsaturated Compounds (A)

Suitable compounds with olefinic double bonds are all compounds that can be crosslinked by free radical polymerization of the double bond. The ethylenically unsaturated compound may be a monomer, an oligomer or a prepolymer, a mixture thereof or a copolymer thereof.

Monomers suitable for free-radical polymerization are, for example, ethylenically unsaturated polymerizable monomers selected from the group consisting of (meth)acrylates, alkenes, conjugated dienes, styrenes, acrolein, vinyl acetate, vinylpyrrolidone, vinylimidazole, maleic anhydride, fumaric anhydride, (meth)acrylic acid, (meth)acrylic acid derivatives such as esters and amides, vinyl halides and vinylidene halides. Preferred are compounds having (meth)acryloyl, vinyl and/or maleinate groups. Especially preferred are (meth)acrylates.

Compounds which contain free-radically polymerizable double bonds in the form of the preferred (meth)acryloyl groups may be produced in accordance with conventional methods. This may proceed, for example, by: transesterifying OH-functional resins, such as OH-functional polyesters, polyacrylates, polyurethanes, polyethers or epoxy resins, with alkyl esters of (meth)acrylic acid; esterifying the stated OH-functional resins with (meth)acrylic acid; reacting the stated OH-functional resins with isocyanate-functional (meth)acrylates; reacting acid-functional resins, such as polyesters, polyacrylates, polyurethanes with epoxy-functional (meth)acrylates; reacting epoxy-functional resins, such as polyesters, poly-acrylates, epoxy resins with (meth)acrylic acid. These production methods stated by way of example are described in the literature and known to the person skilled in the art.

Examples of prepolymers or oligomers include (meth) acryloyl-functional (meth)acrylic copolymers, polyurethane (meth)acrylates, polyester (meth)acrylates, unsaturated polyesters, polyether (meth)acrylates, silicone (meth)acrylates and epoxy resin (meth)acrylates having number-average molecular masses from, for example, 500 to 10,000, preferably 500 to 5,000.

The (meth)acryloyl-functional prepolymers may be used in combination with reactive diluents, i.e., free-radically polymerizable low molecular weight compounds with a molar mass of below 500 g/mol. The reactive diluents may be mono-, di- or polyunsaturated. Examples of monounsaturated reactive diluents are (meth)acrylic acid and the esters thereof, maleic acid and the esters thereof, vinyl acetate, vinyl ether, substituted vinyl ureas, styrene, vinyltoluene. Examples of diunsaturated reactive diluents are di(meth) acrylates such as alkylene glycol di(meth)acrylate, polyethylene glycol di(meth)acrylate, 1,3-butanediol di-(meth)acrylate, vinyl (meth)acrylate, allyl (meth)acrylate, divinylbenzene, dipropylene glycol di(meth)acrylate, hexanediol di(meth)acrylate. Examples of polyunsaturated reactive diluents are glycerol tri(meth)acrylate, trimethylolpropane tri(meth)acrylate, pentaerythritol tri(meth)-acrylate, pentaerythritol tetra(meth)acrylate. The reactive diluents may be used alone or in mixture.

Suitable salts of acrylic acid or methacrylic acid are, for example, $(C_1-C_4alkyl)_4$ammonium or $(C_1-C_4alkyl)_3$NH salts, e.g. the tetramethylammonium, tetraethylammonium, trimethylammonium or triethylammonium salt, the trimethyl-2-hydroxyethylammonium or triethyl-2-hydroxy-ethylammonium salt, the dimethyl-2-hydroxyethylammonium or diethyl-2-hydroxyethylammonium salt.

The ethylenically unsaturated compounds may contain, in addition to the olefinic double bonds, one or more further, identical or different functional groups. Examples of functional groups include hydroxyl, isocyanate (optionally blocked), N-methylol, N-methylolether, ester, carbamate, epoxy, amino (optionally blocked), acetoacetyl, alkoxysilyl and carboxyl groups. Examples are polyurethane resins with (meth)acryloyl groups and glycerol mono- and di-(meth) acrylate, trimethylol propane mono- and di(meth)acrylate or pentaerythritol tri(meth)-acrylate.

The photopolymerisable compounds (A) can be used on their own or in any desired mixture.

Additives

The above-described compositions may further comprise customary additives, which may, as an alternative, also be added after the polymerization. Such additives can be added in small amounts, e.g. UV-absorbers or light stabilizers, e.g. compounds selected from the group consisting of hydroxyphenylbenzotriazoles, hydroxyphenylbenzophenones, oxalamides and hydroxyphenyl-s-triazines. Particularly suitable light stabilizers are those selected from the group consisting of N-alkoxy-Hals compounds such as Tinuvin 123, or of sterically hindered amines Hals compounds of the 2-(2-hydroxyphenyl)-1,3,5-triazine or 2-hydroxyphenyl-2H-benzotriazole type. Examples of light stabilizers of the 2-(2-hydroxyphenyl)-1,3,5-triazine type are known from the patent literature, e.g. U.S. Pat. No. 4,619,956, EP-A-434 608, U.S. Pat. No. 5,198,498, U.S. Pat. No. 5,322,868, U.S. Pat. No. 5,369,140, U.S. Pat. No. 5,298,067, WO-94/18278; EP-A-704 437, GB-A-2,297,091 or WO-96/28431. 3,3,5,5 polysubstituted morpholin-2-one derivatives as described in U.S. Pat. No. 6,140,326 are well established light stabilizers for coatings.

The compositions may further comprise other customary additives such as leveling agents, rheology-influencing agents, such as, fine-particle silicic acid, layer silicates, urea compounds; thickeners, e.g., based on partially cross-linked carboxy-functional polymers or polyurethanes; defoamers, wetting agents, anti-crater agents, degassing agents, e.g., benzoin, antioxidants.

The compounds may further comprise additives to improve the storage stability such as polymerization inhibitors on nitroxyl basis, e.g. Irgastab UV10 and 2,2,6,6-tetramethyl-4-hydroxy-piperidin-1-oxyl (4-hydroxy-TEMPO).

The photoinitaitors of the formula I are suitable in double-curing and in dual curing systems.

Double-Curing

Double curable systems comprise ethylenically unsaturated monomers, which can be polymerized by UV radiation or which can be polymerized thermally induced by IR or NIR radiation or by convection heat. In double curable systems in addition to the photoinitiator, a thermal initiator is present. Any thermal initiator known in the art may be used. Preferably, the additional thermal initiators are peroxides such as dialkyl peroxides, dicumyl peroxide, peroxo carboxylic acids and so one and azo initiators as disclosed in U.S. Pat. No. 5,922,473.

Dual-Curing

Dual curable systems comprise ethylenically unsaturated monomers, which can be polymerized thermally induced by IR or NIR radiation or by convection heat. Furthermore, at least one second thermal crosslinkable compound is present. The second compound preferably crosslinks via a polyol-isocyanate reaction to form a polyurethane.

The composition may contain fillers and/or transparent, color- and/or special effect-imparting pigments and/or soluble dyes. Examples of inorganic or organic color-imparting pigments include titanium dioxide, micronized titanium dioxide, iron oxide pigments, carbon black, azo pigments, phthalocyanine pigments, quinacridone or pyrrolopyrrole pigments. Examples of special effect-imparting pigments include metallic pigments, e.g., of aluminum, copper or other metals; interference pigments, such as, metal oxide-coated metallic pigments, e.g., titanium dioxide-coated or mixed oxide-coated aluminum, coated mica, such as, titanium dioxide-coated mica and graphite special-effect pigments. Examples of suitable fillers include silica, aluminum silicate, barium sulfate, calcium carbonate and talc.

In addition to the photoinitiator of formula I another known photoinitiator may be present, for example, α-hydroxyketones and α-aminoketones, phenylglyoxalates or phosphine oxides are photoinitiators commonly used in graphic arts applications.

Especially preferred are, for example, the following commercially available photoinitiators:

Darocur 1173: 2-hydroxy-2-methyl-1-phenyl-1-propanone (HMPP) and Oligomeric HMPP, Irgacure 184: 1-hydroxy-cyclohexyl-phenylketone, Irgacure 2959: 2-hydroxy-1-[4-(2-hydroxyethoxy)phenyl]-2-methyl-1-propanone, Irgacure 369: 2-benzyl-2-(dimethylamino)-1-[4-(4-morpholinyl)phenyl]-1-butanone, Irgacure 1300: Irgacure 369+Irgacure 651 (benzildimethylketal), Irgacure 379: 2-(4-Methylbenzyl)-2-(dimethylamino)-1-[4-(4-morpholinyl)phenyl]-1-butanone, Irgacure 127: 2-Hydroxy-1-{4-[4-(2-hydroxy-2-methyl-propionyl)-benzyl]-phenyl}-2-methyl-propan-1-one, Irgacure 754: oxo-phenyl-acetic acid 1-methyl-2-[2-(2-oxo-2-phenyl-acetoxy)-propoxy]-ethyl ester, Irgacure 819: bis(2,4,6-trimethylbenzoyl)-phenylphosphine oxide, Irgacur 250: 4-isobutylphenyl-4'-methylphenyl iodonium hexafluorophosphate, Darocur ITX: 2-isopropylthioxanthone and 4-isopropylthioxanthone, Darocur EDB: ethyl-4-dimethylamino benzoate, Darocur EHA: 2-ethylhexyl-4-dimethylamino benzoate; or mixtures of the above photoinitiators.

The photopolymerisable compositions comprise the photoinitiator advantageously in an amount from 0.05 to 15% by weight, preferably from 0.1 to 8% by weight, based on the composition.

In dual curing systems at least one second thermal crosslinkable compound is present selected from 1. surface coatings based on cold- or hot-crosslinkable alkyd, acrylate, polyester, epoxy or melamine resins or mixtures of such resins, optionally with the addition of a curing catalyst;
2. two-component polyurethane surface coatings based on hydroxyl-group-containing acrylate, polyester or polyether resins and aliphatic or aromatic isocyanates, isocyanurates or polyisocyanates;
3. two-component polyurethane surface coatings based on thiol-group-containing acrylate, polyester or polyether resins and aliphatic or aromatic isocyanates, isocyanurates or polyisocyanates;
4. one-component polyurethane surface coatings based on blocked isocyanates, isocyanurates or polyisocyanates which are deblocked during stoving; the addition of melamine resins is also possible, if desired;
5. one-component polyurethane surface coatings based on aliphatic or aromatic urethanes or polyurethanes and hydroxyl-group-containing acrylate, polyester or polyether resins;
6. one-component polyurethane surface coatings based on aliphatic or aromatic urethane acrylates or polyurethane acrylates having free amine groups in the urethane structure and melamine resins or polyether resins, optionally with the addition of a curing catalyst;
7. two-component surface coatings based on (poly)ketimines and aliphatic or aromatic isocyanates, isocyanurates or polyisocyanates;
8. two-component surface coatings based on (poly)ketimines and an unsaturated acrylate resin or a polyacetoacetate resin or a methacrylamidoglycolate methyl ester;
9. two-component surface coatings based on carboxyl- or amino-group-containing polyacrylates and polyepoxides;
10. two-component surface coatings based on anhydride-group-containing acrylate resins and a polyhydroxy or polyamino component;
11. two-component surface coatings based on acrylate-containing anhydrides and poly-epoxides;
12. two-component surface coatings based on (poly)oxazolines and anhydride-group-containing acrylate resins or unsaturated acrylate resins or aliphatic or aromatic isocyanates, isocyanurates or polyisocyanates;
13. two-component surface coatings based on unsaturated (poly)acrylates and (poly)-malonates;
14. thermoplastic polyacrylate surface coatings based on thermoplastic acrylate resins or extrinsically crosslinking acrylate resins in combination with etherified melamine resins;
15. surface-coating systems, especially clearcoats, based on malonate-blocked isocyanates with melamine resins (e.g. hexamethoxymethylmelamine) as crosslinkers (acid-catalysed);
16. UV-curable systems based on oligomeric urethane acrylates and/or acylate acrylates, optionally with the addition of other oligomers or monomers;
17. dual-cure systems, which are cured first thermally and then by UV, or vice versa, the constituents of the surface-coating formulation containing double bonds that can be caused to react by UV light and photoinitiators and/or by electron-beam curing.

The resulting coating materials of the invention may be conventional coating materials, containing organic solvents, aqueous coating materials, substantially or fully solvent-free and water-free liquid coating materials (100% systems), substantially or fully solvent-free and water-free solid coating materials (powder coating materials), or substantially or fully solvent-free powder coating suspensions (powder slurries).

Non limiting examples of suitable substrates are, for example, wood, textiles, paper, ceramics, glass, glass fibres, plastics such as polyester, polyethylene terephthalate, polyolefins or cellulose acetate, especially in the form of films, and also metals such as Al, Cu, Ni, Fe, Zn, Mg or Co and GaAs, Si or $SiO_2$.

The coating composition may also be an ink composition. Thus, the substrate is printed with an ink composition to form an ink film on the substrate.

Preparation of the Coating

The components of the formulation and optionally further additives are applied uniformly to a substrate by means of known coating techniques, for example by spin-coating, immersion, knife coating, curtain pouring, brush application or spraying, especially by electrostatic spraying and reverse-roll coating, and also by electrophoretic deposition. The quantity applied (coat thickness) and the nature of the substrate (layer support) are dependent on the desired field of application. The range of coat thicknesses generally comprises values from 0.1 µm to 1 mm for gel coates and more than 1 mm for composites.

Use

The photocurable compositions according to the invention are suitable for a variety of purposes, for example for over-print coatings, for inkjet inks, for printing inks, especially flexographic printing inks, for clearcoats, whitecoats or color-pigmented paint, for example for wood or metal, for powder coatings, as coating materials for substrates of all kinds, e.g. wood, textiles, paper, ceramics, glass, glass fibres, plastics, such as polyesters, polyethylene terephthalate, polyolefins or cellulose acetate, especially in the form of films, and also for metals, such as Al, Cu, Ni, Fe or Zn and GaAs, Si or $SiO_2$, to which a protective coating is to be applied or an image is to be applied by imagewise exposure.

Examples of coatings for metal include the application of a finish to metal sheets and tubes, cans or bottle closures, and topcoats for applications in the automobile industry.

Examples of the photocuring of paper coatings are the application of a colourless finish to labels or book covers.

The photopolymerisable compositions can furthermore be used as daylight-curable paints for marking structures and roads, for photographic reproduction techniques, for holographic recording materials, for image recording processes or in the production of printing plates that can be developed using organic solvents or using aqueous alkaline media, for the production of masks for screen printing, as dental filling compounds, as adhesives, as pressure-sensitive adhesives, as laminating resins, as etch resists or permanent resists, both liquid and in the form of dry films, as photostructurable dielectrics, and as solder resists for electronic circuits, as resists in the production of color filters for any type of display screen, or in the creation of structures during the production of plasma displays and electroluminescent displays, in the production of optical switches, optical gratings (interference gratings), in the production of three-dimensional articles by bulk curing (UV curing in transparent moulds) or by the stereolithography process, as described, for example, in U.S. Pat. No. 4,575,330, in the production of composite materials (e.g. styrene polyesters which may, where appropriate, include glass fibres and/or other fibres and other adjuvants), and of fine layers (gel coats) and thick-layered compositions, in the coating or sealing of electronic components, or as coatings for optical fibres. The compositions are suitable, furthermore, for the production of optical lenses, e.g. contact lenses or Fresnel lenses, and also for the production of medical instruments, aids or implants.

The compositions may also be used to produce gels having thermotropic properties, such as are described, for example, in DE 197 00 064 and EP 678 534.

A preferred area of use is in overprint coatings. Typically, these consist of ethylenically unsaturated compounds, such as oligomeric and/or monomeric acrylates and aminoacrylates. Suitable compounds are listed under "compound (A)". The compounds and mixtures according to the invention are especially effective in overprint coatings of small layer thickness (5-10 μm).

A further preferred area of use is in UV-curable flexographic printing inks.

Such inks likewise consist of ethylenically unsaturated compounds (A) and comprise in addition UV flexographic resin/binder as well as further additives, such as flow agents and coloured pigments.

A further preferred area of use is in powder coatings. The powder coatings may be based on solid resins and monomers containing reactive double bonds (compounds (A)), e.g. maleates, vinyl ethers, acrylates, acrylamides and mixtures thereof. The powder coatings may also comprise binders, such as are described, for example, in DE 4 228 514 and EP 636 669. The UV-curable powder coatings may also comprise white or coloured pigments.

A further preferred area of use is in inkjet inks.

Inkjet inks contain a colorant.

A wide variety of organic and inorganic dyes and pigments, alone or in combination, may be selected for use in the inkjet ink compositions of this invention. The pigment particles should be sufficiently small (0.005 to 15 μm) to permit free flow of the ink at the ejecting nozzles. The pigment particles should preferably be 0.005 to 1 μm.

Very fine dispersions of pigments and their preparation are disclosed in e.g. U.S. Pat. No. 5,538,548.

The pigment can be black, white, cyan, magenta, yellow, red, blue, green, brown, mixtures thereof, and the like. For example, suitable pigment materials include carbon blacks such as Regal 400R, Mogul L, Elftex 320 from Cabot Colo., or Carbon Black FW18, Special Black 250, Special Black 350, Special Black 550, Printex 25, Printex 35, Printex 55, Printex 150T from Degussa Co., and Pigment Black 7. Additional examples of suitable pigments are disclosed in, for example, U.S. Pat. No. 5,389,133.

Suitable white pigments are titanium dioxide (modifications rutile and anatas), e.g. KRONOS 2063 from Kronos, or HOMBITAN R610 L from Sachtleben.

Suitable pigments include, for instance, C. I. Pigment Yellow 17, C. I. Pigment Blue 27, C. I. Pigment Red 49:2, C. I. Pigment Red 81:1, C. I. Pigment Red 81:3, C. I. Pigment Red 81:x, C. I. Pigment Yellow 83, C. I. Pigment Red 57:1, C. I. Pigment Red 49:1, C. I. Pigment Violet 23, C. I. Pigment Green 7, C. I. Pigment Blue 61, C. I. Pigment Red 48:1, C. I. Pigment Red 52:1, C. I. Pigment Violet 1, C. I. Pigment White 6, C. I. Pigment Blue 15, C. I. Pigment Yellow 12, C. I. Pigment Blue 56, C. I. Pigment Orange 5, C. I. Pigment Black 7, C. I. Pigment Yellow 14, C. I. Pigment Red 48:2, C. I. Pigment Blue 15:3, C. I. Pigment Yellow 1, C. I. Pigment Yellow 3, C. I. Pigment Yellow 13, C. I. Pigment Orange 16, C. I. Pigment Yellow 55, C. I. Pigment Red 41, C. I. Pigment Orange 34, C. I. Pigment Blue 62, C. I. Pigment Red 22, C. I. Pigment Red 170, C. I. Pigment Red 88, C. I. Pigment Yellow 151, C. I. Pigment Red 184, C. I. Pigment Blue 1:2, C. I. Pigment Red 3, C. I. Pigment Blue 15:1, C.I. Pigment Blue 15:3, C.I. Pigment Blue 15:4, C. I. Pigment Red 23, C. I. Pigment Red 112, C. I. Pigment Yellow 126, C. I. Pigment Red 169, C. I. Pigment Orange 13, C. I. Pigment Red 1-10, 12, C.I. Pigment Blue 1:X, C.I. Pigment Yellow 42, C.I. Pigment Red 101, C.I. Pigment Brown 6, C. I. Pigment Brown 7, C. I. Pigment Brown 7:X, C. I. Pigment Black 11, C. I. Pigment Metal 1, C. I. Pigment Metal 2, C.I. Pigment Yellow 128, C.I. Pigment Yellow 93, C.I. Pigment Yellow 74, C.I. Pigment Yellow 138, C.I. Pigment Yellow 139, C.I. Pigment Yellow 154, C. I. Pigment Yellow 185, C.I. Pigment Yellow 180, C.I. Pigment Red 122, C.I. Pigment Red 184, and bridged aluminum phtalocyanine pigments, C. I. Pigment Red 254, C. I. Pigment Red 255, C.I. Pigment Red 264, C. I. Pigment Red 270, C.I. Pigment Red 272, C. I. Pigment Violet 19, C.I. Pigment Red 166, C.I. Pigment Red 144 C.I. Pigment Red 202, C. I. Pigment Yellow 110, C. I. Pigment Yellow 128, C. I. Pigment Yellow 150, C. I. Pigment Orange 71, C. I. Pigment Orange 64, C. I. Pigment Blue 60.

The pigment may, but need not, be in the form of a dispersion comprising a dispersant, also called pigment stabilizer. The latter may be, for example, of the polyester, polyurethane or polyacrylate type, especially in the form of a high molecular weight block copolymer, and would typically be incorporated at 2.5% to 100% by weight of the pigment. An example of a polyurethane dispersant is EFKA 4047.

Further pigment dispersions are (UNISPERSE, IRGASPERSE) and ORASOL Dyes (solvent soluble dyes): C.I. Solvent Yellow 146, C.I. Solvent Yellow 88, C.I. Solvent Yellow 89, C.I. Solvent Yellow 25, C.I. Solvent Orange 11, C.I. Solvent Orange 99, C.I. Solvent Brown 42, C.I. Solvent Brown 43, C.I. Solvent Brown 44, C.I. Solvent Red 130, C.I. Solvent Red 233, C.I. Solvent Red 125, C.I. Solvent Red 122, C.I. Solvent Red 127, C.I. Solvent Blue 136, C.I. Solvent Blue 67, C.I. Solvent Blue 70, C.I. Solvent Black 28, C.I. Solvent Black 29

Especially emphazised are the MICROLITH-pigment preparations commercially available from Ciba Specialty Chemicals Inc. These pigment dispersions may be organic or inorganic pigments predispersed in a variety of resins, e.g. in vinyl resins, acrylic resins and aromatic polyurethane resins. MICROLITH-WA may for example be a line of pigments predispersed in alkaline water/alcohol soluble acrylic resin (specially developed for aqueous gravure and flexographic printing) with pigments that may be compatible with UV and inkjet printing inks.

The Microlith-K inkjet products are used in vinyl-based inks, which can be formulated to give good adhesion to many substrates, from plasticized and rigid PVC and metal foils, to polymer coated regenerated cellulose films.

Inkjet inks of the present invention may also more generally include other pigment preparations such as chips or in situ combination during grinding of pigments (as described above) and hyperdispersants (e.g. Solsperse as available from Avecia) into the binder carrier.

The substrates can be coated by applying a liquid composition, a solution or suspension to the substrate. The choice of solvent and the concentration are guided primarily by the nature of the composition and by the coating technique. The solvent should be inert, i.e. it should not enter into any chemical reaction with the components and it should be able to be removed again in the course of drying after coating. Examples of suitable solvents are ketones, ethers and esters, such as methyl ethyl ketone, isobutyl methyl ketone, cyclo-pentanone, cyclohexanone, N-methylpyrrolidone, dioxane, tetrahydrofuran, 2-methoxy-ethanol, 2-ethoxyethanol, 1-methoxy-2-propanol, 1,2-dimethoxyethane, ethyl acetate, n-butyl acetate and ethyl 3-ethoxypropionate.

The formulation is applied uniformly to a substrate by means of known coating techniques, for example by spincoating, dipping, knife coating, curtain coating techniques, brush application, spraying, especially by electrostatic spraying, and reverse roll coating, and also by electrophoretic deposition. It is also possible to apply the photosensitive layer to a temporary flexible support and then to transfer the layer by lamination to the final substrate. Examples of methods of application can be found e.g. in Ullmann's Encyclopedia of Industrial Chemistry, $5^{th}$ edition, Vol. A18, pp. 491-500.

The amount applied (layer thickness) and the nature of the substrate (layer support) are dependent on the desired field of application. The range of dry film thicknesses generally embraces values from about 0.1 µm to more than 100 µm.

The photosensitivity of the compositions of the invention generally ranges from about 200 nm into the NIR or IR region.

NIR (Near Infrared)-Curing

The NIR radiation used in the process according to the invention is short-wave infrared radiation in the wavelength range from about 750 nm to about 1500 nm, preferably 750 nm to 1200 nm. Radiation sources for NIR radiation include, for example, conventional NIR radiation emitters, which are available commercially (for example, from Adphos).

IR-Curing

The IR radiation used in the process according to the invention is medium-wave radiation in the wavelength range from about 1500 nm to about 3000 nm and/or longer-wave infrared radiation in the wavelength range above 3000 nm.

IR radiation emitters of this kind are available commercially (for example, from Heraeus).

UV-Curing

The photochemical curing step is carried out usually using light of wavelengths from about 200 nm to about 600 nm, especially from 200 to 450 nm. As light sources there are used a large number of the most varied types. Both point sources and planiform projectors (lamp carpets) are suitable. Examples are: carbon arc lamps, xenon arc lamps, medium-, high- and low-pressure mercury lamps, optionally doped with metal halides (metal halide lamps), microwave-excited metal-vapor lamps, excimer lamps, super actinic fluorescent tubes, fluorescent lamps, argon filament lamps, electronic flash lamps, photographic flood lights, electron beams light emitting diodes (LED) and X-rays generated by means of synchrotrons or laser plasma.

As already mentioned, curing in the process of the invention may take place solely by exposure to electromagnetic radiation. Depending on the composition of the formulation to be cured, however, thermal curing before, during or after irradiation is advantageous.

Thermal curing takes place in accordance with methods known to the person skilled in the art. Curing is generally carried out in an oven, e.g. a circulating air oven, on a hotplate, or by irradiation using IR lamps. Curing without aids at room temperature is likewise possible, depending on the binder system used. The curing temperatures are generally from room temperature to 150° C., e.g. 25-150° C. or 50-150° C. In the case of powder coatings or "coil coat" coatings, the curing temperatures may also be higher, e.g. up to 350° C.

The invention relates also to a method of producing a scratch-resistant durable surface, wherein a composition that either contains an ethylenically unsaturated compound and a photoinitiator of formula I, is applied to a support; and curing of the formulation is carried out either solely by irradiation with electromagnetic radiation of a wavelength ranging from 200 nm into the NIR or IR region, or by irradiation with electromagnetic radiation and prior, simultaneous and/or subsequent action of heat.

The invention relates also to the use of the above-described composition and to a process for the production of pigmented and unpigmented surface coatings, overprint coatings, formulations for printing inks, inkjet inks, powder coatings, fine layers (gel coats), composite materials or glass fibre cable coatings.

The invention further relates to the use of the compounds of formula I to prepare multifunctional photoinitiators.

EXAMPLES

Example 1

Synthesis of 2-benzyl-1-[4-(2-hydroxyethylamino) phenyl]-2-dimethylamino-1-butanone

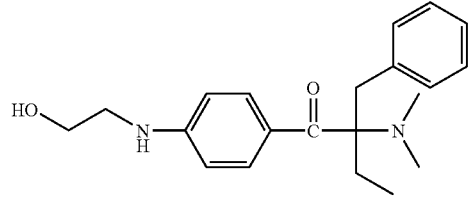

1.1: 2-Benzyl-1-(4-fluorophenyl)-2-dimethylamino-1-butanone

This compound is prepared according to the procedure in EP-0284561-A2 (example 1 B).

1.2: 2-Benzyl-1-[4-(2-hydroxyethyamino)phenyl]-2-dimethylamino-1-butanone 44.9 g (0.15 mol) 2-Benzyl-1-(4-fluorophenyl)-2-dimethylamino-1-butanone and 61.08 g (1.05 mol) ethanolamine are dissolved in 400 ml dimethylacetamide. 41.5 (0.3 mol) Potassium carbonate are added and the suspension is heated to 140° C. while stirring. The reaction mixture is kept at this temperature during 16 hours, cooled to room temperature and diluted with water. The aqueous phase is several times extracted with ethyl acetate, the combined organic extracts washed with water and dried over magnesium sulfate. Evaporation of the solvent gives the crude product as a yellowish-brown oil. The product is purified by chromatography on silica gel (eluent: petroleum ether/ethyl acetate 2:1→1:1). The fractions containing the product are collected to give a slightly yellowish solid product. Recrystallisation from ethyl acetate/hexane gave 2-benzyl-1-[4-(2-hydroxyethylamino) phenyl]-2-dimethylamino-1-butanone as slightly yellowish crystals melting at 109-111° C. Yield: 34.7 g (68%). $^1$H-NMR data are in agreement with the proposed structure.

Elemental analysis: $C_{21}H_{28}N_2O_2$ (MG=340.5)

|  | C % | H % | N % |
|---|---|---|---|
| calculated: | 74.08 | 8.29 | 8.23 |
| found: | 73.95 | 8.42 | 7.99 |

Example 2

Synthesis of 2-[(4-aminophenyl)methyl]-1-[4-(2-hydroxyethyamino)phenyl]-2-dimethylamino-1-butanone

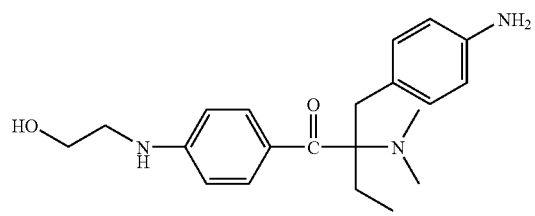

2.1: 2-[(4-Nitrophenyl)methyl]-1-(4-fluorophenyl)-2-dimethylamino-1-butanone

2-Benzyl-1-(4-fluorophenyl)-2-dimethylamino-1-butanone, obtained as described for example 1.1, is added dropwise at 0-5° C. to fuming nitric acid. After the addition, the reaction mixture is stirred for one hour and subsequently poured onto ice/water. The solution is extracted several times with methyl ethyl ketone, the organic extracts dried over magnesium sulfate and the solvent evaporated. The crude product is thus obtained as a brownish oil, which is purified by flash chromatography on silica gel using petroleum ether/ethyl acetate 4:1 as eluent. 2-[(4-Nitrophenyl)methyl]-1-(4-fluorophenyl)-2-dimethylamino-1-butanone is obtained as a yellowish oil that is used for the next step without further purification.

2.2: 2-[(4-Aminophenyl)methyl]-1-(4-fluorophenyl)-2-dimethylamino-1-butanone 7.0 g Palladium on charcoal (5%) are added to solution of 69.5 g (0.178 mol) 2-[(4-nitro-phenyl)methyl]-1-(4-fluorophenyl)-2-dimethylamino-1-butanone in 700 ml ethanol in an hydrogenation autoclave. Hydrogen is entered with a continuous increase of pressure to 5 bar at temperature between room temperature and 40° C. After 25 hours no further hydrogen uptake is observed. The catalyst is filtered off and the crude product obtained as yellowish oil after evaporation of the solvent. Thin film chromatography shows a main product and some minor by-products. The crude material is used without further purification in the next reaction step.

2.3: 2-[(4-aminophenyl)methyl]-1-[4-(2-hydroxyethyamino)phenyl]-2-dimethylamino-1-butan-one 23.5 g (0.078 mol) 2-[(4-aminophenyl)methyl]-1-(4-fluorophenyl)-2-dimethylamino-1-butanone are reacted with ethanol amine (33.4 g, 0.55 mol) under conditions as described for example 1.2. The crude product obtained is purified by first by filtration over silica gel using hexane/ethyl acetate 1:1→ethyl acetate as the eluent, followed by flash chromatography on silica gel (eluant: ethyl acetate). 10.2 g (37%) 2-[(4-aminophenyl)methyl]-1-[4-(2-hydroxyethyamino)phenyl]-2-dimethylamino-1-butanone are obtained as a viscous yellow oil.

$^1$H NMR (ppm; TMS=0 ppm as internal standard); 8.3 (d, 2H—C(2')/C(6')); 7.0 (d, 2H—C(2''') and C(6''')); 6.62 (d, 2H—C(3''') and C(5''')); 6.53 (d, 2H—C(3')/C(5')); 3.83 (t, 2H—C(8')); 3.33 (t, 2H—C(7')); 3.07 (broad s, 2NH); 2.95 (d, 2H—C(1''')); 2.36 (s, 6H (CH$_3$—N)); 2.02 (m, 1H—(C (1''); 1.81 (m, 1H—(C(1''); 0.71 (t, 3H—C(2'').

Elemental analysis: $C_{21}H_{29}N_3O_2$ (MG=355.48)

|  | C % | H % | N % |
|---|---|---|---|
| calculated: | 70.95 | 8.22 | 11.82 |
| found: | 69.11 | 8.51 | 11.22 |

Example 3

Synthesis of 2-ethyl-1-[4-(2-hydroxyethyamino) phenyl]-2-dimethylamino-1-pent-4-en-1-one

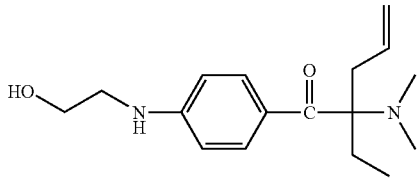

3.1: 1-(4-Fluorophenyl)-2-dimethylamino-1-butanone

This compound is prepared according to the procedure in EP-02845610-A2 (example 1 A).

3.2. 2-Ethyl-1-(4-fluorophenyl)-2-dimethylamino-pent-4-en-1-one 76 g (0.363 mol) 1-(4-Fluorophenyl)-2-dimethylamino-1-butanone are dissolved in 300 ml methyl ethyl ketone. While stirring at room temperature, 48.3 g (0.4 mol) 1-bromo-prop-2-ene are added over one hour to give a beige suspension. The reaction mixture is stirred for 18 hours at room temperature and then heated to 70° C. At this temperature 29.05 g (0.73 mol) powdered sodium hydroxide are added. The reaction mixture turns orange and is subsequently cooled to room temperature. The mixture is diluted with water and dichloromethane. The organic phase is separated, dried over magnesium sulfate and the solvent evaporated. The crude product thus obtained is purified by flash chromatography on silica gel, using petroleum ether/ethyl acetate as the eluent. 2-Ethyl-1-(4-fluorophenyl)-2-dimethyl-amino-pent-4-en-1-one is obtained as a yellowish liquid. Yield: 56.9 g (63%). $^1$H-NMR data are in agreement with the proposed structure.

3.3: 2-Ethyl-1-[4-(2-hydroxyethyamino)phenyl]-2-dimethylamino-pent-4-en-1-one 24.9 g (0.1 mol) 2-Ethyl-1-(4-fluorophenyl)-2-dimethylamino-pent-4-en-1-one are reacted with ethanol amine under conditions as described for example 1.2. The crude product is obtained as yellowish liquid, which is further, purified by chromatography on silica gel using petroleum ether/ethyl acetate as eluent. The fractions containing the product are collected and the compound recrystallized from hexane. 2-Allyl-1-[4-(2-hydroxyethyamino)phenyl]-2-dimethyl-amino-1-butanone (16.2 g, 56%) is obtained as slightly yellowish crystals with a melting point of 90-92° C. %).
$^1$H-NMR data are in agreement with the proposed structure.

$^1$H NMR (ppm; TMS=0 ppm as internal standard); 8.3 (d, 2H—C(2')/C(6')); 6.54 (d, 2H—C(3')/C(5')); 5.94 (m, H—C(4)); 5.07 (dxd, 1H—C(5); 4.98 (dxd, 1H—C(5)); 3.87 (t, 2H—C(8'); 3.37 (t, 2H—C(7')); 2.7-2.5 (m, 2H—C(3)); 2.44 (s, 6H (CH$_3$—N)); 2.15-1.8 (m, 3H, 2H—(C(1") and OH); 0.73 (t, 3H—C(2").

Example 4

Synthesis of 1-[4-(2-hydroxyethyamino)phenyl]-2-methyl-2-dimethylamino-1-pent-4-en-1-one

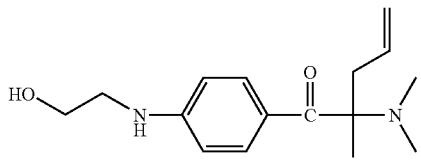

This compounds is prepared by the same procedure as Example 2, except that 1-(4-fluorophenyl)-2-dimethylamino-1-propanone is used as the starting material.

$^1$H NMR (ppm; TMS=0 ppm as internal standard); 8.43 (d, 2H—C(2')/C(6')); 6.54 (d, 2H—C(3')/C(5')); 5.54 (m, H—C(4)); 4.90 (dxd, 1H—C(5); 4.87 (dxd, 1H—C(5)); 3.87 (t, 2H—C(8'); 3.37 (t, 2H—C(7')); 2.75 (dxd, 1H—C(3)); 2.40 (dxd. 1H—C(3)); 2.26 (s, 6H (CH$_3$—N)); 1.74 (broad s, OH); 1.17 (s, 3H—C(1").

Example 5

Synthesis of 2-ethyl-1-[4-(2-hydroxyethyamino)phenyl]-2-(morpholin-4-yl)-1-pent-4-en-1-one

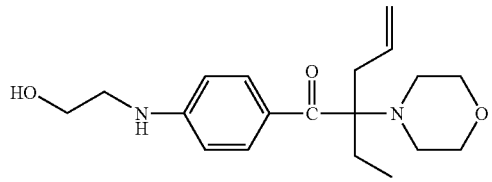

5.1 1-(4-Fluorophenyl)-2-(morpholin-4-yl)-1-butanone 85.3 g (0.98 mol) morpholine are dissolved in 200 ml tetrahydrofurane and cooled to 0° C. 100 g (0.41 mol) 1-(4-Fluorophenyl)-2-bromo-1-butanone (obtained according to the process described in EP-A-3002) in 200 ml tetrahydrofurane are added dropwise to this solution at 0° C. The reaction mixture is then heated to 50° C. during 16 hours before cooling to room temperature. The mixture is poured into water and extracted several times with ethyl acetate. The organic phase is dried with magnesium sulfate and the solvent evaporated in vacuo. 1-(4-Fluorophenyl)-2-(morpholin-4-yl)-1-butanone (102 g, 99%) is thus obtained as a brownish liquid, the structure being confirmed by $^1$H-NMR analysis. The crude product is used without further purification for the next reaction step.

5.2 2-Ethyl-1-(4-fluorophenyl)-2-(morpholin-4-yl)-pent-4-en-1-one 56 g of a 50% suspension of sodium hydride in mineral oil (0.22 mol sodium hydride) is added to 100 ml dimethylformamide. 45.2 g (0.16 mol) 1-(4-Fluorophenyl)-2-(morpholin-4-yl)-1-butanone, dissolved in 50 ml diemethylformamide, are added to this suspension dropwise and at room temperature, and subsequently stirred overnight. Then, 19.36 g 1-brom-2-propene are added dropwise. The temperature raises to 50° C. and the solution is kept at this temperature for 16 hours. After cooling, excess sodium hydride is destroyed by the addition of 5 ml isopropanol and the reaction mixture subsequently poured onto an ice/water mixture. The organic products are extracted with ethyl acetate, the combined extracts dried over magnesium sulfate and the solvent evaporated. The crude product thus obtained is purified by chromatography silica gel (eluent: ethyl acetate/petroleum ether 4:1). 2-Ethyl-1-(4-fluoro-phenyl)-2-(morpholin-4-yl)-pent-4-en-1-one (17.8 g, 38%) is obtained as a yellowish oil. $^1$H-NMR analysis is in agreement with the proposed structure. This compound is used for the next step.

5.3. 2-Ethyl-1-[4-(2-hydroxyethyamino)phenyl]-2-(morpholin-4-yl)-1-pent-4-en-1-one 11.4 g (0.04 mol) 2-Ethyl-1-(4-fluorophenyl)-2-(morpholin-4-yl)-pent-4-en-1-one are reacted with 17.1 g (0.28 mol) ethanolamine under conditions as described for example 1.2. The crude product is purified by chromatography on silica gel using petroleum ether/ethyl acetate 2:3 as eluent. Pure 2-ethyl-1-[4-(2-hydroxyethyamino)phenyl]-2-(morpholin-4-yl)-1-pent-4-en-1-one (3.6 g, 27%) is obtained as a yellowish viscous oil.

$^1$H NMR (ppm; TMS=0 ppm as internal standard); 8.41 (d, 2H—C(2')/C(6')); 6.52 (d, 2H—C(3')/C(5')); 5.92 (m, H—C(4)); 5.08 (dxd, 1H—C(5); 5.02 (dxd, 1H—C(5)); 4.77 (broad s, OH); 3.84 (t, 2H—C(8'); 3.62 (7.4H—C(2''') and C(6''')); 3.34 (broad t, 2H—C(7')); 2.9-2.85 (m, 2H—C(3)); 2.25-2.10 (m, 4H—C(3''') and C(5''')); 2.10-1.85 (m, 2H—C(1")); 0.72 (t, 3H_C(2")).

Elemental analysis: C$_{19}$H$_{28}$N$_2$O$_5$ (MG=332.44)

|  | C % | H % | N % |
|---|---|---|---|
| calculated: | 68.65 | 8.49 | 8.43 |
| found: | 68.32 | 8.58 | 8.37 |

Example 6

Synthesis of 1-[4-(2-hydroxyethyamino)phenyl]-2-methyl-2-(morpholin-4-yl)-1-propanone

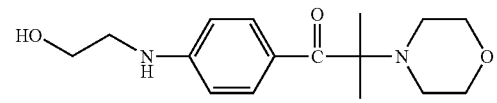

9.6 g (0.03 mol) 1-(4-fluorophenyl)-2-(morpholin-4-yl)-1-propanone (prepared as described in DE 19753655-A1, example 1b) are reacted with 12.85 g (0.21 mol) ethanolamine under conditions as described for example 1.2. The crude product is purified by chromatography on silica gel using petroleum ether/ethyl acetate 1:2 as eluent. The fractions containing the product are collected and the brownish crystals recrystallized from hexane/ethyl acetate 4:1. Pure 1-[4-(2-hydroxyethyamino)phenyl]-2-methyl-2-(morpholin-4-yl)-1-propanone (5.1 g, 58%) is obtained as beige crystals with a melting point of 77-78° C.

Elemental analysis: $C_{16}H_{24}N_2O_3$ (MG=292.4)

|  | C % | H % | N % |
|---|---|---|---|
| calculated: | 65.73 | 8.27 | 9.58 |
| found: | 65.82 | 8.31 | 9.72 |

Example 7

Synthesis of 2-ethyl-1-[4-(2-hydroxyethyamino) phenyl]-2-dimethylamino-1-pentan-1-one

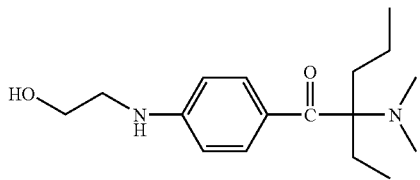

10.1 g 2-Allyl-1-[4-(2-hydroxyethyamino)phenyl]-2-dimethylamino-1-butanone are dissolved in 100 ml ethyl acetate. After addition of 1 g Pd/carbon 5%, the reaction mixture is treated with hydrogen at normal pressure until an uptake of 0.78 l $H_2$ (100%) is reached. After filtration of the catalyst the solvent is evaporated. The crude product is recrystallized from hexane to give 6.8 g (67%) 2-ethyl-1-[4-(2-hydroxyethyamino)phenyl]-2-dimethylamino-1-pentan-1-one as a slightly yellowish solid with a melting point of 74-77° C.

Elemental analysis: $C_{17}H_{28}N_2O_2$ (MG=292.4)

|  | C % | H % | N % |
|---|---|---|---|
| calculated: | 69.83 | 9.65 | 9.58 |
| found: | 69.99 | 9.52 | 9.53 |

Example 8

Synthesis of 2-Benzyl-2-dimethylamino-1-{[4-(2-acetoxyethyl-2-hydroxyethyl-amino)-phenyl}-1-butanone

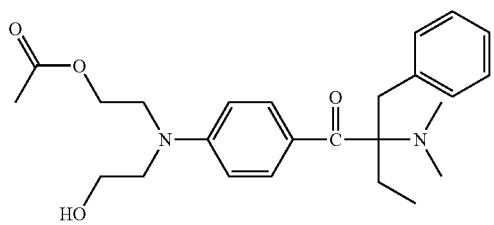

8.1: 1-{[4-[Bis(2-hydroxyethyl)amino]phenyl}-1-butanone 49.5 g (0.3 mol) 1-(4-Fluorophenyl)-1-butanon and 315.4 g (3.0 mol) are heated in a steel autoclave under a pressure of 8-10 bar to 200° C. during 100 hours. After cooling the reaction mixture is poured on ice/water, the organic phase is separated and the water phase extracted several times with ethyl acetate. The organic extracts are dried over magnesium sulfate and the solvent evaporated. The brownish crude product is filtered over silica gel using ethyl acetate/petroleum ether as eluent. 1-{[4-[Bis(2-hydroxyethy)amino]phenyl}-1-butanone is obtained as a solid which is recrystallized in ethyl acetate/hexane 7:2 to give the product as a beige solid with a melting point of 72-75° C.

8.2: 1-{[4-[Bis(2-acetoxyethyl)amino]phenyl}-2-bromo-1-butanone 34.9 g (0.138 mol) 1-{[4-[Bis(2-hydroxyethy)amino]phenyl}-1-butanone are dissolved in 500 ml acetic acid. The solution is saturated with gaseous hydrogen chloride and subsequently cooled to 0-5° C. 22.2 g (0.138 mol) bromine are added at this temperature over 90 minutes. The reaction mixture is subsequently stirred over night at room temperature. After heating under a stream of nitrogen, the reaction mixture is poured slowly into 550 ml of 30% sodium hydroxide solution. Extraction with ethyl acetate, followed by drying over magnesium sulfate and evaporation of the solvent gives 55 g 1-{[4-[bis(2-acetoxyethyl)amino]phenyl}-2-bromo-1-butanone as a brownish liquid.

$^1$H NMR (ppm; TMS=0 ppm as internal standard); 7.91 (d, 2H—C(2')/C(6')); 6.77 (d, 2H—C(3')/C(5')); 5.05 (t, H—C (2)); 4.27 (t, 42H—C(2")); 3.69 (t, 4H—C(1")); 2.16 (txd, 2H—C(3)); 2.05 (s. 6H $CH_3CO$); 1.05 (t, 3H—C(4)).

8.3: 2-Dimethylamino-1-{[4-[bis(2-acetoxyethyl)amino] phenyl}-1-butanone 25 g (0.06 mol) 1-{[4-[bis(2-acetoxyethyl)amino]phenyl}2-bromo-1-butanone are added dropwise to 25 g of a 33% solution of dimethylamine in ethanol (0.18 mol dimethylamine) at 0° C. The reaction mixture is stirred over night at room temperature, after which the solvent subsequently is evaporated in vacuum. 20.0 g (88%) 2-Dimethylamino-1-{[4-[bis(2-acetoxy-ethyl)amino]phenyl}-1-butanone are obtained as a yellowish liquid which is used in the next reaction step without further purification.

$^1$H NMR (ppm; TMS=0 ppm as internal standard); 7.98 (d, 2H—C(2')/C(6')); 6.77 (d, 2H—C(3')/C(5')); 4.27 (t, 4H—C (2")); 3.80 (m, H—C(2)); 3.71 (t, 4H—C(1")); 2.32 (s, 6H $CH_3$—N); 2.05 (s. 6H $CH_3CO$); 1.72 (txd, 2H—C(3)); 0.85 (t, 3H—C(4)).

8.4.: 2-Benzyl-2-dimethylamino-1-{[4-[bis(2-acetoxyethyl) amino]phenyl}-1-butanone To a solution of 12.5 g 2-dimethylamino-1-{[4-[bis(2-acetoxyethyl)amino]phenyl}-1-butanone in 25 ml methyl ethyl ketone, 5.64 g (0.033 mol) benzyl bromide are added dropwise. The reaction mixture is heated to 70° C. during four hours. Then, 2.64 g (0.066 mol) powdered sodium hydroxide are added and the mixture heated for another two hours. After cooling, the reaction mixture is diluted with water and ethyl acetate. The organic phase is separated, dried over magnesium sulfate and the solvent evaporated to give a yellowish viscous liquid. This crude reaction mixture is purified by chromatography on silica gel using petroleum ether/ethyl acetate 1:1 as the eluent. A first fraction isolated consists of 8.4 g 2-Benzyl-2-dimethylamino-1-{[4-[bis(2-acetoxyethyl) amino]phenyl}-1-butanone, obtained as a yellowish oil.

Elemental analysis: $C_{27}H_{36}N_2O_5$ (MG=468.59)

|  | C % | H % | N % |
|---|---|---|---|
| calculated: | 69.21 | 7.74 | 5.98 |
| found: | 69.40 | 8.13 | 5.49 |

8.5.: 2-Benzyl-2-dimethylamino-1-{[4-(2-acetoxyethyl-2-hydroxyethyl-amino)-phenyl}-1-butanone A second fraction from the chromatography described under 8.4 contains 3.4 g 2-benzyl-2-dimethylamino-1-{[4-(2-acetoxyethyl-2-hydroxyethyl-amino)-phenyl}-1-butanone as a yellowish oil.

$^1$H-NMR (ppm; TMS=0 ppm as internal standard); 8.34 (d, 2H—C(2')/C(6')); 7.21 (m. 5H, benzylic protons); 6.68 (d, 2H—C(3')/C(5')); 4.31 (t, 2H—C(2")—OCOCH$_3$); 3.84 (t, 2H—C(2")—OH); 3.70 (t, 2H—C(1")—CH$_2$OCOCH$_3$); 3.61 (t, 2H—C(1")—CH$_2$OH); 3.18 (dxd, 2H—C(1'); 2.34 (s, 6H CH$_3$—N); 2.02 (s. 3H CH$_3$CO); 2.05 and 1.85 (m, 2H—C(3)); 0.68 (t, 3H'C(4)).

Example 9

Synthesis of 2-benzyl-1-{[4-[bis(2-hydroxyethy)amino]phenyl}-2-dimethylamino-1-butanone

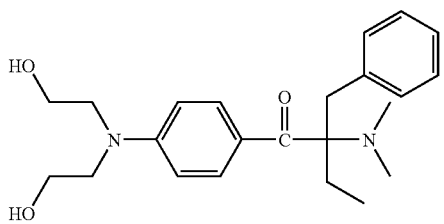

3.4 g (0.008 mol) 2-Benzyl-2-dimethylamino-1-{[4-(2-acetoxyethyl-2-hydroxyethyl-amino)-phenyl}-1-butanone, obtained according to example 8.5, are suspended in water and treated with powdered sodium hydroxide at 70° C. and then at reflux. After five hours, the reaction mixture is cooled to room temperature and extracted with ethyl acetate. The organic solution is dried over magnesium sulfate and the solvent evaporated. 1.7 g (55%) 2-benzyl-1-{[4-[bis(2-hydroxyethy)amino]phenyl}-2-dimethylamino-1-butanone are obtained as yellowish oil after chromatography on silicagel using petroleum ether/ethyl acetate as eluent.

$^1$H-NMR (ppm; TMS=0 ppm as internal standard); 8.33 (d, 2H—C(2')/C(6')); 7.21 (m. 5H, benzylic protons); 6.59 (d, 2H—C(3')/C(5')); 3.88 (t, 4H—C(2")); 3.64 (t, 4H—C(1")); 3.18 (dxd, 2H—C(1'); 2.34 (s, 6H CH$_3$—N); 2.05 and 1.85 (m, 2H—C(3)); 0.68 (t, 3H—C(4)).

Elemental analysis: $C_{23}H_{32}N_2O_3$ (MG=384.52)

|  | C % | H % | N % |
|---|---|---|---|
| calculated: | 71.84 | 8.39 | 7.29 |
| found: | 71.11 | 8.54 | 6.91 |

Example 10

Synthesis of 2-dimethylamino-1-{[4-(2-acetoxy-ethyl-2-hydroxyethyl-amino)-phenyl}-2-ethyl-1-pent-4-en-1-one

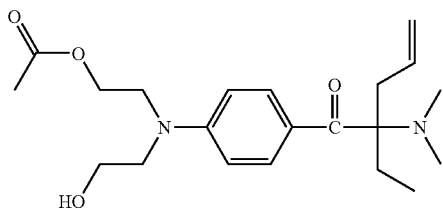

This compound is prepared analogous to the procedure described for example 8, except that allyl bromide is used instead of benzyl bromide in step 8.4. The compound is obtained as a yellowish viscous oil.

$^1$H-NMR (ppm; TMS=0 ppm as internal standard); 8.34 (d, 2H—C(2')/C(6')); 6.67 (d, 2H—C(3')/C(5')); 5.94 (m, 1H, H—C(4)); 5.06 (dxd, 1H H—C(5)); 4.99 (dxd, 1H, H—C(5)); 4.30 (t, 2H—C(2")—OCOCH$_3$); 3.84 (t, 2H—C(2")—OH); 3.71 (t, 2H—C(1")—CH$_2$OCOCH$_3$); 3.61 (t, 2H—C(1")—CH$_2$OH); 2.64 (m, 2H—C(3); 2.41 (s, 6H CH$_3$—N); 2.04 (s. 3H CH$_3$CO); 2.05 and 1.85 (m, 2H—C(1')); 0.68 (t, 3H—C(2')).

Elemental analysis: $C_{21}H_{32}N_2O_4$ (MG=376.50)

|  | C % | H % | N % |
|---|---|---|---|
| calculated: | 66.99 | 8.57 | 7.44 |
| found: | 66.63 | 8.56 | 6.86 |

Example 11

Synthesis of 2-dimethylamino-1-{[4-[bis(2-hydroxyethy)amino]-phenyl}-2-ethyl-1-pent-4-en-1-one

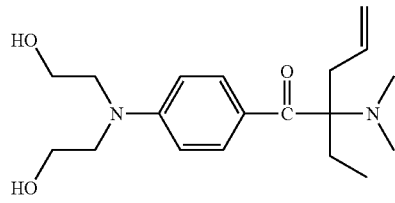

This compound is prepared analogous to the procedure described for example 9, except that the compound of example 10 is used as starting material. The compound is obtained as a yellowish viscous oil.

$^1$H-NMR (ppm; TMS=0 ppm as internal standard); 8.33 (d, 2H—C(2')/C(6')); 6.57 (d, 2H—C(3')/C(5')); 5.90 (m, 1H, H—C(4)); 5.06 (dxd, 1H H—C(5)); 4.99 (dxd, 1H, H—C(5)); 3.85 (t, 4H—C(2")); 3.62 (t, 4H—C(1")); 2.64 (m, 2H—C(3); 2.40 (s, 6H CH$_3$—N); 2.02 and 1.86 (m, 2H—C(1')); 0.70 (t, 3H—C(2')).

Elemental analysis: $C_{19}H_{30}N_2O_3$ (MG=334.46)

|  | C % | H % | N % |
|---|---|---|---|
| calculated: | 68.23 | 9.04 | 8.38 |
| found: | 67.63 | 9.33 | 7.80 |

Example 12

Synthesis of 2-dimethylamino-1-{[4-[bis(2-hydroxyethy)amino]-phenyl}-2-ethyl-1-pentan-1-one

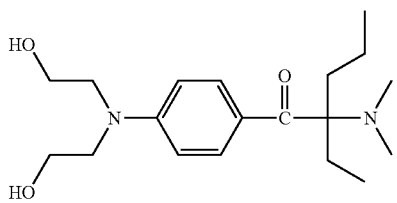

This compound is prepared analogous to the procedure described for example 7, except that the compound of example 11 is used as starting material for the hydrogenation. The compound is obtained as a yellowish viscous oil.

$^1$H-NMR (ppm; TMS=0 ppm as internal standard); 8.29 (d, 2H—C(2')/C(6')); 6.57 (d, 2H—C(3')/C(5'); 3.85 (t, 4H—C(2")); 3.62 (t, 4H—C(1")); 2.40 (s, 6H CH$_3$—N); 1.85 (m, 4H, 2H—C(3) and 2H—C(1')); 1.15 (m, 2H—C(4)); 0.85 (t, 3H—C(5)); 0.78 (t, 3H—C(2')).

Elemental analysis: $C_{19}H_{32}N_2O_3$ (MG=336.47)

|  | C % | H % | N % |
|---|---|---|---|
| calculated: | 67.82 | 9.59 | 8.33 |
| found: | 66.85 | 9.54 | 7.75 |

Example 13

Synthesis of Synthesis of 1-{[4-[bis(2-hydroxyethy)amino]-phenyl}-2-ethyl-2-morpholin-4-yl)-1-pent-4-en-1-one

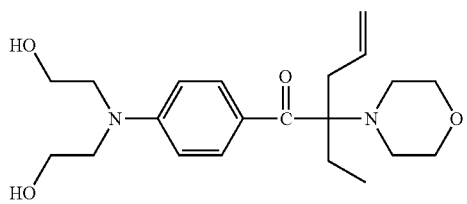

This compound is prepared analogous to the procedure described for example 11, except that in the amination step morpholine is used in stead of dimethylamine. The compound is obtained as a yellowish viscous oil.

$^1$H-NMR (ppm; TMS=0 ppm as internal standard); 7.98 (d, 2H—C(2')/C(6')); 6.68 (d, 2H—C(3')/C(5')); 5.85 (m, 1H, H—C(4)); 5.25 (dxd, 1H H—C(5)); 5.18 (dxd, 1H, H—C(5)); 4.0-3.55 (4 m, 14H, 4H—C(2"), 4H—C(1"), 4H—C(2'"/6'") and 2H—C(3)); 2.60 (m, 4H—C(3'"/5'")); 1.90 and 1.75 (m, 2H—C(1')); 0.85 (t, 3H—C(2')).

Elemental analysis: $C_{21}H_{32}N_2O_4$ (MG=376.47)

|  | C % | H % | N % |
|---|---|---|---|
| calculated: | 66.99 | 8.57 | 7.44 |
| found: | 66.78 | 8.62 | 7.24 |

Example 14

Synthesis of 2-benzyl-1-{4-[(2-hydroxyethyl)-acryloyl-amino]phenyl}-2-dimethylamino-1-butanone

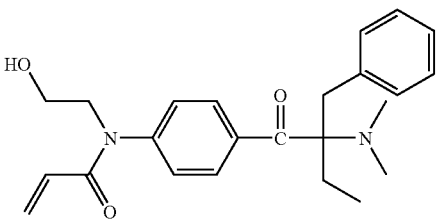

6.0 g (0.018 mol) 2-Benzyl-1-[4-(2-hydroxyethylamino)phenyl]-2-dimethylamino-1-butanone (example 1) is dissolved in 50 ml methyl ethyl ketone and cooled to 0-5° C. A solution of 1.4 g sodium hydroxide in 5 ml water is added, followed by the dropwise addition of 1.8 g acryloyl chloride. When the addition is complete, the reaction mixture is stirred for an additional 10 minutes and poured in water. The organic phase is separated, dried over magnesium sulfate and the solvent evaporated in vacuo. The brownish oil obtained is purified by chromatography on silica gel, using petroleum ether/ethyl acetate as eluent. A first fraction (2.0 g) consists according to $^1$H-NMR-analysis of 60% 2-benzyl-1-{4-[(2-acryloyloxyethyl)-amino]phenyl}2-dimethylamino-1-butanone and 40% 2-benzyl-1-{4-[(2-acryloyloxyethyl)-acryloyl-amino]phenyl}-2-dimethylamino-1-butanone.

A second fraction (2.0 g) is pure 2-benzyl-1-{4-[(2-hydroxyethyl)-acryloyl-amino]phenyl}-2-dimethylamino-1-butanone.

$^1$H-NMR (ppm; TMS=0 ppm as internal standard); 8.38 (d, 2H—C(2')/C(6')); 7.3-7.1 (m, 2H—C(3')/C(5') and 5 benzylic protons); 6.42 (dxd, 1H, H—C(3'")); 6.05 (dxd, 1H H—C(3'")); 5.61 (dxd, 1H, H—C(2'")); 4.0 (t, 2H—C(2")); 3.82 (t, 2H—C(1"); 3.20 (m, 2H—C(1')); 2.38 (s, 6H, CH3-N); 2.10 and 1.82 (m, 2H—C(3)); 0.71 (t, 3H—C(4)). The IR spectrum (KBr) shows an amide band at 1670 cm$^{-1}$.

Elemental analysis: $C_{24}H_{30}N_2O_3$ (MG=394.52)

|  | C % | H % | N % |
|---|---|---|---|
| calculated: | 73.07 | 7.67 | 7.10 |
| found: | 73.60 | 8.45 | 6.26 |

Example 15

Synthesis of 2-Dimethylamino-2-ethyl-1-{4-[(2-hydroxy-ethyl)-methyl-amino]-phenyl}-pent-4-en-1-one

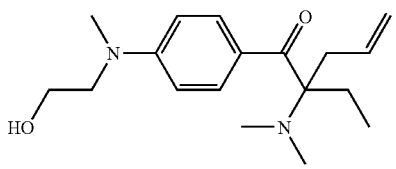

In a 300 ml sulfonation under argon atmosphere, 2.90 g (10 mmol) of 2-dimethylamino-2-ethyl-1-[4-(2-hydroxy-ethylamino)-phenyl]-pent-4-en-1-one are dissolved in 55 ml THF and 137 ml acetonitrile. 4.5 ml (60 mmol) of a 37% aqueous formaldehyde solution are added over 10 min. at 25° C., followed by 2.21 g (30 mmol) of sodium cyanoborohydride. After 10 min at 25° C., the mixture is stirred at 50° C. for 4 h, cooled to room temperature and diluted with 100 ml water. The yellow semi-solid is redissolved in methylene chloride, washed with 20 ml of aq. sat. NaHCO$_3$ and water, the organic phase dried with brine and sodium sulfate, and evaporated under vacuum to give 2.3 g (75%) of the title compound as a yellow oil.

$^1$H-NMR (CDCl$_3$, 400 MHz); [ppm]: 8.30 (d, 2H), 6.66 (d, 2H), 5.85-5.96 (m, 1H), 5.01-5.11 (m, 2H), 3.85 (t, 2H), 3.58 (t, 2H), 3.08 (s, 3H), 2.64-2.75 (m, 2H), 2.47 (s, 6H), 1.91-2.07 (m, 2H), 0.73 (t, 3H).

Example 16

Synthesis of 2,8-diallyl-2,8-bis-dimethylamino-1.9-bis-[4-(2-hydroxy-ethylamino)-phenyl]-nonane-1,9-dione

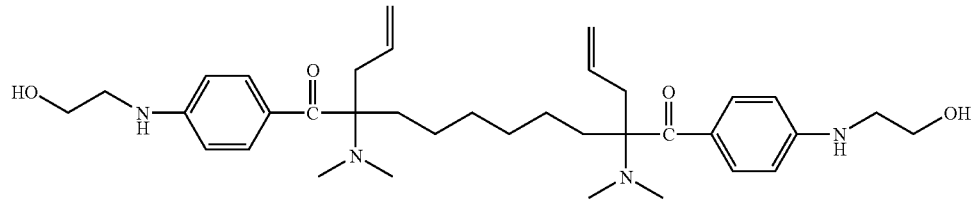

16.1.: 1.9-Bis-(4-fluoro-phenyl)-nonane-1,9-dione

To a suspension of 32.0 g AlCl$_3$ in 290 ml fluorobenzene, 25 g azealic acid dichloride is added at 0-10° C. while stirring. The reaction mixture was stirred over night and subsequently hydrolysed with dilute hydrogen chloride. After extraction with dichloromethane, drying over magnesium sulfate and evaporation of the solvent, 37.4 g 1.9-bis-(4-fluoro-phenyl)-nonane-1,9-dione are obtained as a yellowish liquid.

$^1$H-NMR (ppm; TMS=0 ppm as internal standard); 8.00 (m, 2H—C(2')/C(6')); 7.15 (m, 2H—C(3')/C(5')); 2.94 (t, 4H—C(2) and C(8)); 1.73 (m, 4H—C(3) and C(7)); 1.40 (m, 6H—C(4), C(5) and C(6)).

16.2.: 2,8-Dibromo-1.9-bis-(4-fluoro-phenyl)-nonane-1,9-dione 37.4 g (0.11 mol) 1.9-bis-(4-fluoro-phenyl)-nonane-1,9-dione are brominated with 35.16 g (0.22 mol) bromine under conditions analogous to those described in example 8.2. 57.9 g 2,8-Dibromo-1.9-bis-(4-fluoro-phenyl)-nonane-1,9-dione are obtained, which are used for the next reaction step without further purification.

$^1$H-NMR (ppm; TMS=0 ppm as internal standard); 8.07 (m, 2H—C(2')/C(6')); 7.20 (m, 2H—C(3')/C(5')); 5.06 (t, 2H—C(2) and C(8)); 2.18 (m, 4H—C(3) and C(7)); 1.51 (m, 6H—C(4), C(5) and C(6)).

16.3.: 2,8-dimethylamino-1.9-bis-(4-fluoro-phenyl)-nonane-1,9-dione 30.2 g 2,8-Dibromo-1.9-bis-(4-fluoro-phenyl)-nonane-1,9-dione are reacted with 5.6 mol dimethylamine under the conditions described for example 8.3. 23.9 g 2,8-dimethylamino-1.9-bis-(4-fluoro-phenyl)-nonane-1,9-dione are obtained as yellowish viscous oil.

$^1$H-NMR (ppm; TMS=0 ppm as internal standard); 8.09 (m, 2H—C(2')/C(6')); 7.08 (m, 2H—C(3')/C(5')); 3.82 (m, 2H—C(2) and C(8)); 2.29 (6H, CH$_3$—N); 1.8 and 1.6 (2 m, 4H—C(3) and C(7)); 1.35-1.10 (m, 6H—C(4), C(5) and C(6)).

16.4.: 2,8-Diallyl-2,8-dimethylamino-1.9-bis-(4-fluoro-phenyl)-nonane-1,9-dione 12.9 g 2,8-Dimethylamino-1.9-bis-(4-fluoro-phenyl)-nonane-1,9-dione (30 mmol) are reacted with 7.98 g (66 mmol) allyl bromide under the conditions described for example 3.2. 8.66 g (57%) 2,8-Diallyl-2,8-dimethylamino-1.9-bis-(4-fluoro-phenyl)-nonane-1,9-dione are obtained as a viscous yellowish oil, which is purified by chromatography on silica gel (eluent: hexane/ethyl acetate 9:1.

$^1$H-NMR (ppm; TMS=0 ppm as internal standard); 8.36 (m, 2H—C(2')/C(6')); 7.00 (m, 2H—C(3')/C(5')); 5.82 (m, 2H—C(2'/2")); 4.99 (dxd, 2H—C(3'/3")); 4.96 (d, 2H—C(3'/3")); 2.55 (m, 2H—C(2) and C(8)); 2.36 (6H, CH$_3$—N); 1.8 and 1.65 (2 m, 4H—C(3) and C(7)); 1.15-0.75 (m, 6H—C(4), C(5) and C(6)).

16.5.: 2,8-Diallyl-2,8-dimethylamino-1.9-bis-[4-(2-hydroxy-ethylamino)-phenyl]-nonane-1,9-dione 9.16 g Ethanolamine (0.15 mol) are reacted with 5.7 g (0.01 mol) 2,8-diallyl-2,8-dimethyl-amino-1.9-bis-(4-fluoro-phenyl)-nonane-1,9-dione in dimethylacetamide under the conditions described for example 1.2. After isolation, the crude product is purified by chromatography on silica gel using isopropanole/dichloromethane and then ethanol/dichloromethane as the eluent. 3.8 g (64%) 2,8-Diallyl-2,8-bis-dimethylamino-1.9-bis-[4-(2-hydroxy-ethylamino)-phenyl]-nonane-1,9-dione are obtained as a very viscous yellowish oil.

$^1$H-NMR (ppm; TMS=0 ppm as internal standard); 8.26 (d, 2H—C(2')/C(6')); 6.51 (d, 2H—C(3')/C(5')); 5.88 (m, 2H—C(2'/2")); 4.99 (dxd, 2H—C(3'/3")); 4.95 (d, 2H—C(3'/3")); 3.85 (m, 4H, 2H—C(2") and 2H—C(2'")); 3.36 (m, 4H, 2H—C(1") and 2H—C(1'")); 2.55 (m, 2H—C(2) and C(8)); 2.35 (6H, CH$_3$—N); 2.0-1.65 (m, 4H—C(3) and C(7)); 1.205-0.70 (m, 6H—C(4), C(5) and C(6)).

Example 17

Synthesis of 2,5-diallyl-2,5-bis-dimethylamino-1.6-bis-[4-(2-hydroxy-ethylamino)-phenyl]-hexan-1,6-dione

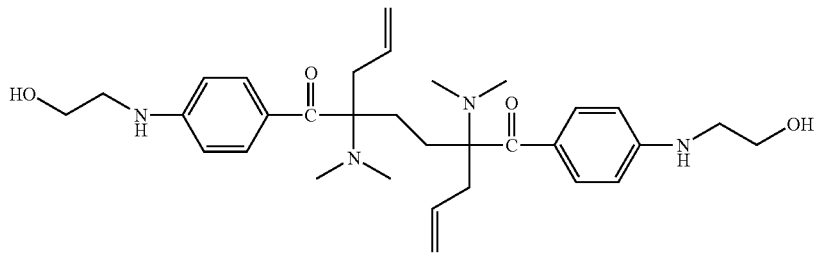

This compound is prepared following the process described for example 15. except that adipoyl dichloride is used in step 15.1. instead of azealic The compound is obtained as a yellowish solid with a melting point of 95-96° C.

Example 18

Synthesis of 2,5-dibenzyl-2,5-bis-dimethylamino-1.6-bis-[4-(2-hydroxy-ethylamino)-phenyl]-hexan-1,6-dione

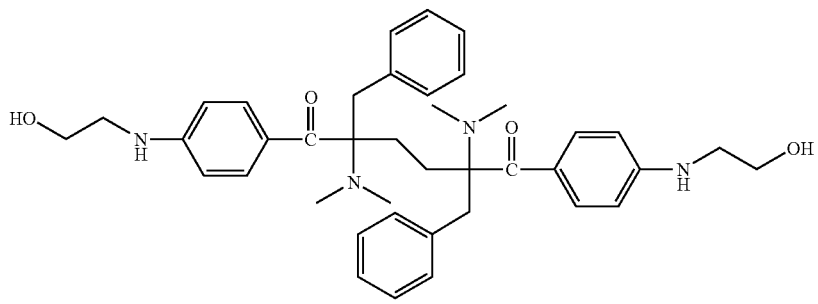

This compound is prepared following the process described for example 16. except that benzyl bromide instead of allyl bromide.

The compound is obtained as a yellowish solid with a melting point of 126-127° C.

Application Example

Example 19

Curing of a Blue Offset Printing Ink on White Paper

A photocurable blue offset printing ink is prepared in accordance with the following formulation:

18.3 g of Ebecryl® 1608 (UCB, Belgium)

18.3 g of Ebecryl® 657 (polyester acrylate from UCB, Belgium)

20.0 g of Ebecryl® 220 (urethane acrylate from UCB, Belgium)

20.9 g of Ebecryl® 150 (bisphenol A derivative diacrylate from UCB, Belgium)

22.5 g Irgalit blue GLO (Cu-phthalocyanine pigment from Ciba Specialty Chemicals)

The above components are grounded down to a stock paste. Portions of the stock paste are mixed with the photoinitiators indicated in the table (% by weight on the stock paste). The solubility of the initiator in the formulation is rated as good (+), acceptable (±) or bad (−) and the results shown in Table 1.

The blue printing ink thus obtained is applied with 1.5 g/m$^2$ (~1.5 μm thickness) on white paper using a Prüfbau laboratory printing equipment. The samples are exposed in an irradiation apparatus with a 80 W/cm mercury lamp (IST). The rate of passage of the sample through the irradiation apparatus is thereby increased continuously until adequate curing no longer occurs. The maximum rate at which the ink still passes the properties test for surface cure and through cure is shown in Table 1. The odor of the cured film is rated on a scale from 1 (odorless) to 3 (strong odor).

| photoinitiator | conc (%) | solubility | curing rate (m/min) for surface cure | curing rate (m/min) for through cure | odor |
|---|---|---|---|---|---|
| Compound of example 1 | 3.0 | + | 100 | 120 | 1 |
|  | 4.0 | + | 140 | 170 | 1 |
| Irgacure 369 | 3.0 | − | 70 | 110 | 1 |
|  | 4.0 | − | 90 | 130 | 1 |
| Irgacure 907 | 4.0 | + | 80 | 90 | 2-3 |

The results show that the compound of example 1 is more efficient as a photoinitiator than the reference compounds while being equal or better soluble and odorless.

Example 20

Curing of a Blue Flexo Printing Ink on a White Polyethylene Foil

A photocurable blue flexo printing ink is prepared in accordance with the following formulation:

26.9 g of IRR 440 (flexo basic resin)
19.0 g of OTA 480 (acrylated trifunctional resin, UCB, Belgium)
18.0 g of Ebecryl® 645 (modified diacrylate of Bisphenol A epoxy resin diluted with 25% of TPGDA, from UCB, Belgium)
13.0 g of HDDA (1,6-hexanediol diacrylate)
10.0 g of Ebecryl® 220 (urethane acrylate from UCB, Belgium)
1.3 g of Ebecryl® 168 (methacrylated acidic compound from UCB, Belgium)
0.7 g of DC 57 (Leveling agent)
11.1 g Irgalit blue GLO (Cu-phthalocyanine pigment from Ciba Specialty Chemicals)

The above components are grounded down to a stock paste. Portions of the stock paste are mixed with the photoinitiators indicated in the table (% by weight on the stock paste). The solubility of the initiator in the formulation is rated as good (+), acceptable (±) or bad (−) and the results shown in Table 2.

The blue printing ink thus obtained is applied with 1.38 g/cm² 1.5 μm thickness on a corona treated white polyethylene foil using a Prüfbau laboratory printing equipment. The samples are exposed in an irradiation apparatus with a 120 W/cm mercury lamp (IST). The rate of passage of the sample through the irradiation apparatus is thereby increased continuously until adequate curing no longer occurs. The maximum rate at which the ink still passes the properties test for surface cure and through cure is shown in Table 1. The adhesion of the cured film to the foil is measure by the Tesa tape test.

| photoinitiator | conc (%) | solubility | curing rate (m/min) for surface cure | curing rate (m/min) for through cure | adhesion |
|---|---|---|---|---|---|
| Compound of example 1 | 6.0 | + | 200 | 40 | + |
| Irgacure 369 | 6.0 | + | 170 | 90 | + |

The invention claimed is:

1. Photoinitiators of the formula I $$\left[ R_{31}-X-L-N(R_{30})-\underset{R_5}{\underset{Z}{Ar}}-\overset{O}{\underset{}{C}}-\underset{R_4\ R_3}{\underset{N}{C}}(R_1)-R_2 \right]_n \quad I$$

wherein
n is 1 or 2;
L is linear or branched $C_2$-$C_{18}$-alkanediyl;
X is —O—;
Z is a direct bond;
$R_1$ is
  (a) linear or branched unsubstituted $C_1$-$C_{12}$-alkyl;
  (b) a radical of the formula;

$$-\underset{R_6}{\underset{|}{CH}}-\underset{R_7}{\underset{|}{C}}=\underset{R_8}{\underset{|}{C}}-R_9, \text{ or}$$

(d) a radical of the formula $$-\underset{H}{\underset{|}{\overset{R_6}{\underset{|}{C}}}}-Ar$$

wherein Ar is phenyl, which is unsubstituted or substituted by one or more of the groups —N($R_{10}$)$_2$, $C_1$-$C_4$-alkyl or $C_1$-$C_4$-alkoxy;
$R_2$ if n is 1, independently of $R_1$ has one of the meanings of $R_1$;
$R_2$ if n is 2, is $C_2$-$C_8$alkylene;
$R_3$ is $C_1$-$C_4$-alkyl or $C_2$-$C_4$-alkyl substituted by hydroxy;
$R_4$ independently of $R_3$ has one of the meanings of $R_3$; or $R_4$ together with $R_3$ is $C_4$-$C_5$-alkylene that may be interrupted by —O—, —N($R_{13}$)—;
$R_5$ is hydrogen or $C_1$-$C_4$-alkyl;
$R_6, R_7, R_8$ and $R_9$ independently of each other are hydrogen or methyl;
$R_{10}$ is hydrogen, $C_1$-$C_4$-alkyl or $C_3$-$C_5$-alkenyl;
$R_{13}$ is hydrogen or $C_1$-$C_4$-alkyl;
$R_{30}$ is hydrogen
$R_{31}$ is hydrogen or $C_2$-$C_6$-alkyl substituted by hydroxy;
with the proviso that the following compounds are excluded:

[Structure: HO-(CH$_2$)$_3$-NH-C$_6$H$_4$-C(=O)-C(CH$_3$)(CH$_2$Ph)-N(CH$_3$)$_2$];

[Structure: HO-(CH$_2$)$_3$-NH-C$_6$H$_4$-C(=O)-C(CH$_3$)(CH$_2$Ph)-N(CH$_3$)(CH$_2$CH$_3$)] and

[Structure: HO-(CH$_2$)$_2$-NH-C$_6$H$_4$-C(=O)-C(CH$_3$)$_2$-N(CH$_3$)$_2$].

2. Photoinitiators according to claim 1, wherein
n is 1 or 2;
L is linear $C_2$-$C_{18}$-alkanediyl;
X is —O—;
Z is a direct bond;
$R_1$ is
  (a) linear or branched unsubstituted $C_1$-$C_3$-alkyl;
  (b) a radical of the formula;

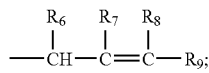

(d) a radical of the formula

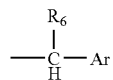

where Ar is phenyl, which is unsubstituted or substituted by $CH_3$;

$R_2$ if n is 1, independently of $R_1$ has one of the meanings of $R_1$;

$R_2$ if n is 2, is $C_2$-$C_8$alkylene;

$R_3$ is methyl, $R_4$ is methyl or $R_4$ together with $R_3$ is $C_5$-alkylene that is interrupted by —O—;

$R_5$ is hydrogen;

$R_6$, $R_7$, $R_8$, and $R_9$ are hydrogen;

$R_{30}$ is hydrogen;

$R_{31}$ is hydrogen.

3. Photoinitiators according to claim 2, wherein n is 1 or 2, $R_1$ is benzyl propyl or allyl and $R_2$ is ethyl or is $C_2$-$C_8$alkylene.

4. Photoinitiators according to claim 1, wherein n is 1 or 2, $R_1$ is benzyl propyl or allyl and $R_2$ is ethyl or is $C_2$-$C_8$alkylene.

5. A composition comprising (A) at least one ethylenically unsaturated compound;

(B) a photoinitiator of formula I as defined in claim 1.

6. A method for photopolymerization of ethylenically unsaturated compounds or mixtures containing ethylenically unsaturated compounds which method comprises preparation of a composition comprising ethylenically unsaturated compounds and compounds of the formula I according to claim 1 and exposure of the composition to electromagnetic radiation.

* * * * *